(12) United States Patent
Choi

(10) Patent No.: US 11,916,566 B2
(45) Date of Patent: Feb. 27, 2024

(54) NFC DEVICE, A METHOD OF OPERATING THE NFC DEVICE AND A COMMUNICATION SYSTEM INCLUDING THE NFC DEVICE

(71) Applicant: Samsung Electronics Co., Ltd., Suwon-si (KR)

(72) Inventor: Jae Hun Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 274 days.

(21) Appl. No.: 17/531,048

(22) Filed: Nov. 19, 2021

(65) Prior Publication Data

US 2022/0337266 A1 Oct. 20, 2022

(30) Foreign Application Priority Data

Apr. 20, 2021 (KR) ................ 10-2021-0050966

(51) Int. Cl.
*H03M 1/48* (2006.01)
*H03M 1/12* (2006.01)
(Continued)

(52) U.S. Cl.
CPC ....... *H03M 1/1245* (2013.01); *H03M 1/0626* (2013.01); *H04B 5/0025* (2013.01)

(58) Field of Classification Search
CPC ............. H03M 1/0626; H03M 1/1245; H03M 1/1255; H04L 7/042; H04L 1/206; H04L 27/0002; H04L 27/0012; H04L 69/24; H04L 7/10; H04L 1/00; H04L 1/0046; H04L 1/0075; H04L 1/06; H04L 25/0204; H04L 25/0228; H04L 25/03273; H04L 25/03853; H04L 25/061; H04L 27/06; H04L 27/22; H04L 27/2605; H04L 27/2662; H04L 5/0048; H04L 69/22; H04L 7/00; H04L 7/033; H04B 1/0007; H04B 1/1027; H04B 5/00; H04B 5/0025; H04B 5/0031; H04B 5/02; H04B 7/0845
(Continued)

(56) References Cited

U.S. PATENT DOCUMENTS 7,419,096 B2 9/2008 Esterberg et al.
8,390,425 B1 * 3/2013 Cooper ................ G06K 7/0008
340/3.6
(Continued)

*Primary Examiner* — Linh V Nguyen
(74) *Attorney, Agent, or Firm* — Muir Patent Law, PLLC

(57) ABSTRACT

An NFC device that receive a data frame with a start pattern including first and second pattern signals, and a data pattern corresponding to the start pattern. The NFC device comprising an analog-to-digital converter which generates first and second input signals based on the first and second pattern signals, respectively, a modem that includes a first sub-matched filter which multiplies a first match signal by the first and second input signals to respectively calculate first and second result values of the first match signal and multiplies a second match signal by the first and second input signals to respectively calculate first and second result values of the second match signal. The first sub-matched filter determines reception of the start pattern when the first and second result values of the first match signal or the first and second result values of the second match signal exceed a predetermined start pattern threshold.

20 Claims, 29 Drawing Sheets

(51) Int. Cl.
*H03M 1/06* (2006.01)
*H04B 5/00* (2006.01)

(58) Field of Classification Search
USPC .................................. 341/115, 155, 181, 182
See application file for complete search history.

(56) References Cited

U.S. PATENT DOCUMENTS

| | | | |
|---|---|---|---|
| 8,724,761 B2* | 5/2014 | Bae | H04L 7/042 |
| | | | 375/359 |
| 9,054,904 B2 | 6/2015 | Jung et al. | |
| 9,106,268 B2 | 8/2015 | Luong et al. | |
| 9,860,017 B2 | 1/2018 | Sung | |
| 10,177,944 B2 | 1/2019 | Sung et al. | |
| 10,389,556 B2* | 8/2019 | Choi | H04L 27/0012 |
| 11,478,545 B2* | 10/2022 | Waxman | H04B 1/713 |
| 11,784,681 B2* | 10/2023 | Wobak | H04B 5/0031 |
| | | | 455/41.1 |
| 2006/0038024 A1* | 2/2006 | Nakadai | G06K 19/0723 |
| | | | 235/492 |
| 2007/0071036 A1 | 3/2007 | Okunev et al. | |
| 2007/0086546 A1 | 4/2007 | Koo et al. | |
| 2011/0064165 A1* | 3/2011 | Bae | H04L 27/22 |
| | | | 375/329 |
| 2016/0233981 A1* | 8/2016 | Sung | H04L 1/0075 |

* cited by examiner

D1(Frame)

$$\sum_{n=0}^{4X+3} x_{d1}[n]s[n-k_{sync}Ts1] > Data\_Th = 2ResultMax; \text{Logic 1}$$

$$\sum_{n=0}^{4X+3} x_{d1}[n]s[n-k_{sync}Ts1] \leq Data\_Th = 2ResultMax; \text{Logic 0}$$

FIG. 15

D2(Frame)

| Preamble | SOF | DATA | CRC | EOF |

D3(Frame)

$$\sum_{n=0}^{8X+7} x_{d3}[n]s'[n-k_{sync}Ts2] > Data\_Th = 4ResultMax; \text{ Logic } 1$$

$$\sum_{n=0}^{8X+7} 2_{d3}[n]s'[n-k_{sync}Ts2] \leq Data\_Th = 4ResultMax; \text{ Logic } 0$$

FIG. 25

D4(Frame)

| Preamble | Sync | Length | DATA | CRC |
|---|---|---|---|---|

$$\sum_{n=0}^{X} x_{d4}[n]s'[n-k_{sync}Ts2] > Data\_Th = ResultMax; \text{ Logic 1}$$

$$\sum_{n=0}^{X} x_{d4}[n]s'[n-k_{sync}Ts2] \leq Data\_Th = ResultMax; \text{ Logic 0}$$

NFC DEVICE, A METHOD OF OPERATING THE NFC DEVICE AND A COMMUNICATION SYSTEM INCLUDING THE NFC DEVICE

This application claims priority from Korean Patent Application No. 10-2021-0050966 filed on Apr. 20, 2021 in the Korean Intellectual Property Office, and all the benefits accruing therefrom under 35 U.S.C. 119, the contents of which in its entirety are herein incorporated by reference.

BACKGROUND

1. Field of the Invention

The present invention relates to an NFC device, a method of operating the NFC device, and a communication system including the NFC device.

2. Description of the Related Art

Electronic devices used in smartphones, vehicles, and the like may be equipped with NFC (Near Field Communication) devices for the purpose of use such as payment and authentication. The NFC devices may be configured together with antennas for transmission and reception.

The NFC device may be exposed to environmental noise signals due to the miniaturization of an antenna in the NFC device caused by the trend toward miniaturization of the electronic device, and the addition of new functions such as wireless charging and ultra-wideband technology. Due to the exposure to such environmental noise signals, deterioration occurs in the distance performance of the NFC device.

In particular, when a noise signal, for example, in the form of a glitch is input, the NFC device may fail to distinguish between the noise signal and a start pattern that identifies the start of a data frame, and the distance performance of the NFC device may deteriorate.

SUMMARY

Aspects of the present invention provide an NFC device in which a reception distance performance is improved by analyzing a start pattern.

Aspects of the present invention also provide a method of operating an NFC device in which a reception distance performance is improved by analyzing a start pattern.

Aspects of the present invention also provide a communication system including an NFC device in which a reception distance performance is improved by analyzing a start pattern.

However, aspects of the present invention are not restricted to the one set forth herein. For example, other aspects of the present invention will become more apparent to one of ordinary skill in the art to which the present invention pertains by referencing the detailed description of the present invention given below.

According to an aspect of the present invention, there is provided an NFC device comprising an antenna which receives a data frame which includes a start pattern including first and second pattern signals modulated by a sub-carrier frequency, and a data pattern corresponding to the start pattern, an analog-to-digital converter which samples the first pattern signal at a sampling period to generate a first input signal, and samples the second pattern signal at the sampling period to generate a second input signal and a modem which receives the first input signal and the second input signal, and determines reception of the start pattern on the basis of the first input signal and the second input signal, wherein the modem includes a first sub-matched filter which multiplies a first match signal generated on the basis of the sampling period by the first input signal to calculate a first result value of the first match signal and multiplies the first match signal by the second input signal to calculate a second result value of the first match signal, and a second sub-matched filter which multiplies a second match signal that is based on the sampling period and has a phase different from the first match signal by the first input signal to calculate a first result value of the second match signal, and multiplies the second match signal by the second input signal to calculate a second result value of the second match signal, and the first sub-matched filter determines reception of the start pattern when the first result value of the first match signal and the second result value of the first match signal exceed a predetermined start pattern threshold or when the first result value of the second match signal and the second result value of the second match signal exceed the predetermined start pattern threshold.

According to another aspect of the present invention, there is provided an NFC device, comprising an antenna which receives a data frame which includes a start pattern including first and second pattern signals modulated by a sub-carrier frequency, and a data pattern corresponding to the start pattern, an analog-to-digital converter which samples each of the first and second pattern signals at a sampling period to generate each of a first input signal and a second input signal, and samples the data pattern at the sampling period to generate a data pattern input signal and a modem which receives the first and second input signals and the data pattern input signal, and reads data included in the data pattern on the basis of the first and second input signals and the data pattern input signal, wherein the modem includes a first sub-matched filter which multiplies a first match signal generated on the basis of the sampling period by the first input signal to calculate a first result value of the first match signal and multiplies the first match signal by the second input signal to calculate a second result value of the first match signal, and a second sub-matched filter which multiplies a second match signal that is based on the sampling period and has a phase different from the first match signal by the first input signal to calculate a first result value of the second match signal, and multiplies the second match signal by the second input signal to calculate a second result value of the second match signal, and the modem reads the data included in the data pattern, on the basis of a maximum result value among the first and second result values of the second match signal and the first and second result values of the second match signal, and the data pattern input signal.

According to another aspect of the present invention, there is provided a method of operating the NFC device, the method comprising setting data type information on the basis of received data type, receiving a data frame which includes a start pattern including first and second pattern signals modulated by a sub-carrier frequency in accordance with the received data type, and a data pattern corresponding to the start pattern, sampling the first pattern signal at a sampling period to generate a first input signal, and sampling the second pattern signal at the sampling period to generate a second input signal and multiplying a first match signal generated on the basis of the sampling period by the first input signal to calculate a first result value of the first match signal, and multiplying the first match signal by the second input signal to calculate a second result value of the first match signal, by a first sub-matched filter, multiplying a second match signal that is based on the sampling period and has a phase different from the first match signal by the first input signal to calculate a first result value of the second match signal, and multiplying the second match signal by the second input signal to calculate a second result value of the second match signal, by a second sub-matched filter which is different from the first sub-matched filter, selecting an enable filter among the first and second sub-matched filters, on the basis of the first and second result values of the first match signal and the first and second result values of the second match signal and reading data included in the data pattern on the basis of the enable filter.

BRIEF DESCRIPTION OF THE DRAWINGS

Aspects and features of the present invention will be more clearly understood from the following detailed description taken in conjunction with the accompanying drawings, in which:

Figure 15:
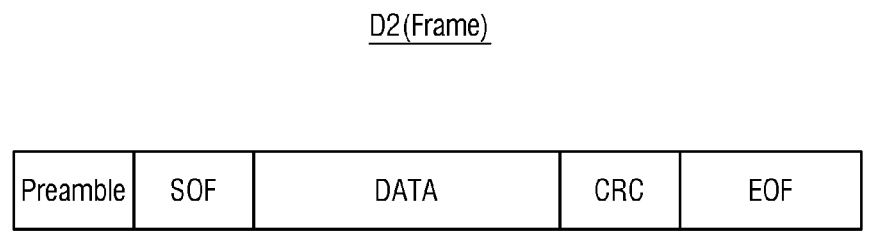

FIGS. 15 to 19 are diagrams for explaining a method of operating the NFC device according to still other embodiments of the present invention;

Figure 25:
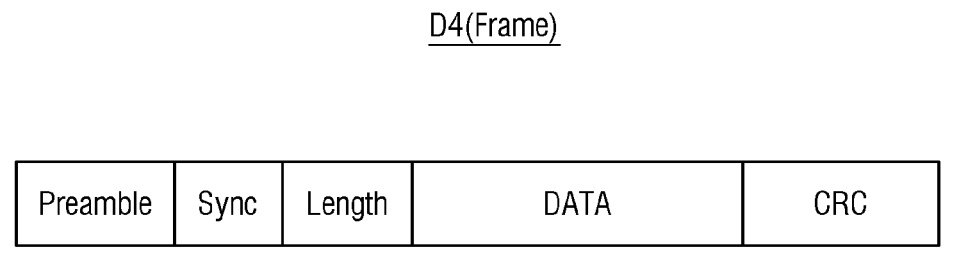

FIGS. 25 to 29 are diagrams for explaining a method of operating the NFC device according to still other embodiments of the present invention.

DETAILED DESCRIPTION OF THE EMBODIMENTS

Figure 1A:
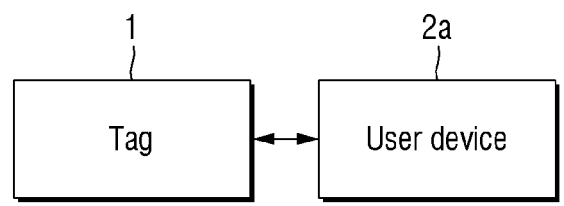
FIGS. 1a and 1b are block diagrams for explaining a communication system according to some embodiments of the present invention.

Hereinafter, embodiments the present invention will be described in detail with reference to the accompanying drawings. In the description of FIGS. 1 to 29, the same reference numerals are used for substantially the same components, and repeated description of the components will not be provided. Also, similar reference numerals are used for similar components throughout the drawings.

Figure 1B:
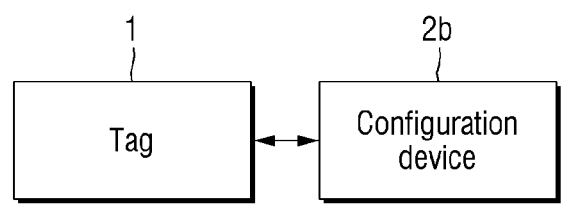

FIGS. 1a and 1b are block diagrams for explaining a communication system according to some embodiments of the present invention.

Referring to FIGS. 1a and 1b, communication systems 1000a and 1000b according to some embodiments of the present invention may be an RFID (Radio-Frequency Identification) system, and may include a tag device 1 and a user device 2a.

The tag device 1 is an electronic device that includes a programmable and scalable single radio frequency front end without specific additional configurations. The tag device 1 may be implemented to transmit and receive one or more I/Q (in-phase (I)/quadrature (Q)) samples to and from an authenticated user in a periodic manner. The tag device 1 may transmit and receive off-line I/Q samples to and from the user device 2a, which is an external transmission/reception device.

The tag device 1 operates in one of a transmission mode, a reception mode or a transmission/reception mode in a multiplex communication technology. The tag device 1 may use at least one communication technology such as a WiFi® (e.g., 2.4 GHz, 5.2 GHz), Bluetooth®, Bluetooth Low Energy® (BLE), cellular network, IEEE 802.15.4. LPWAN (low-power wide-area network) and LTE (Long Term Evolution) to communicate with the user device 2a or a configuration device 2b. The tag device 1 may be expanded to include new technologies without hardware/software changes/dependencies. The tag device 101 may be implemented to operate in different signal message formats.

The tag device 1 may transmit data to the user device 2a depending on function and application. The user device 2a may transmit data to the tag device 1 depending on function and application. The user device 2a may be at least one of an NFC device or an NFC chip in another device that may transmit and receive data from a mobile phone, a computer, a laptop, a tablet, a smartphone, a wearable computing device, a scanning device, a dedicated device or a tag device 1.

Although the NFC device or the NFC chip may use the communication protocols specified by international standards including ISO (the International Organization for Standardization) 14443 type A/type B, and ISO 15693 and Felica, the examples of the communication protocol do not limit aspects of the present invention.

The configuration device 2b may be at least one of an NFC device or an NFC chip in another device that may communicate with the mobile phone, the computer, the laptop, the tablet, the smartphone, the wearable computing device, the scanning device, the dedicated device or the tag device 1. The user device 2a and the configuration device 2b according to some embodiments may be implemented in the same manner, but are not limited thereto.

Figure 2:
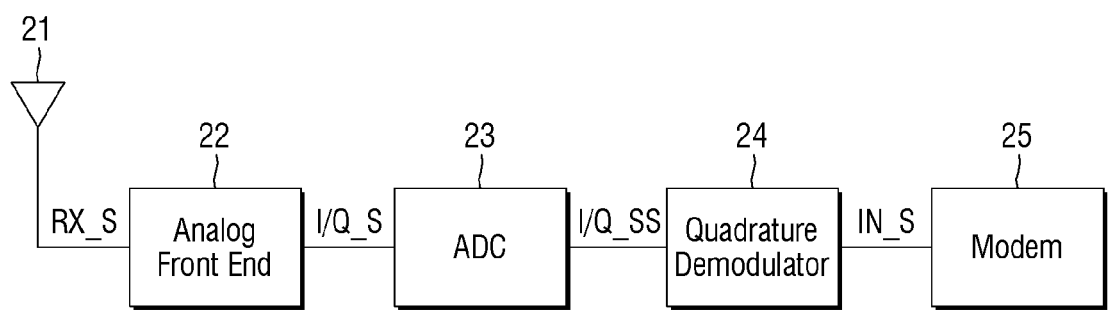
FIGS. 2 and 3 are diagrams for explaining an input signal which is input to the NFC device.
Figure 3:
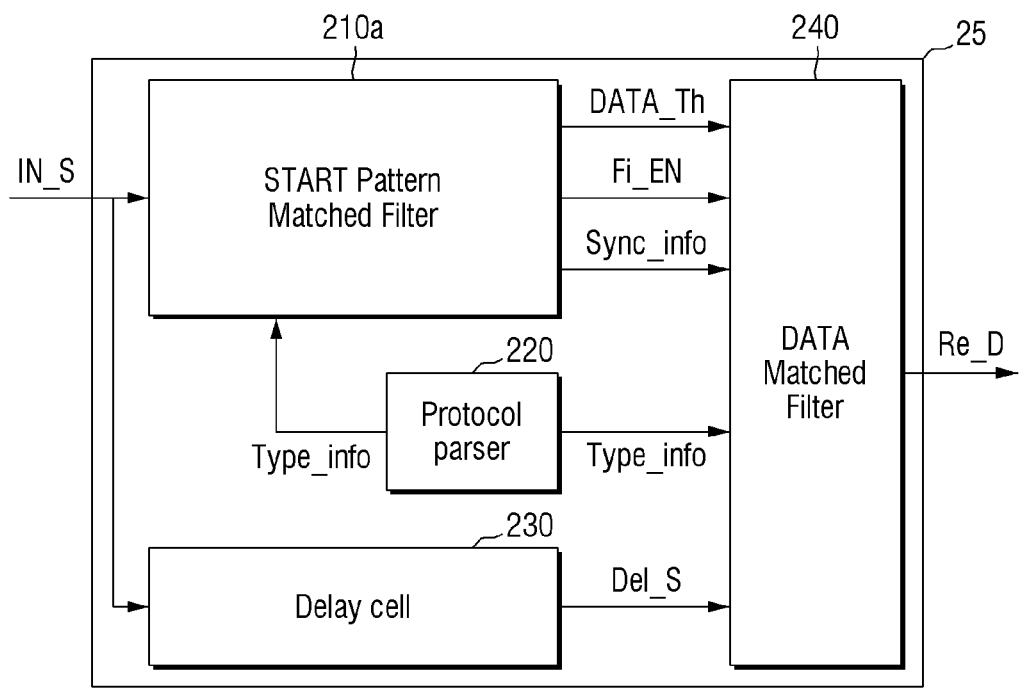
Figure 4:
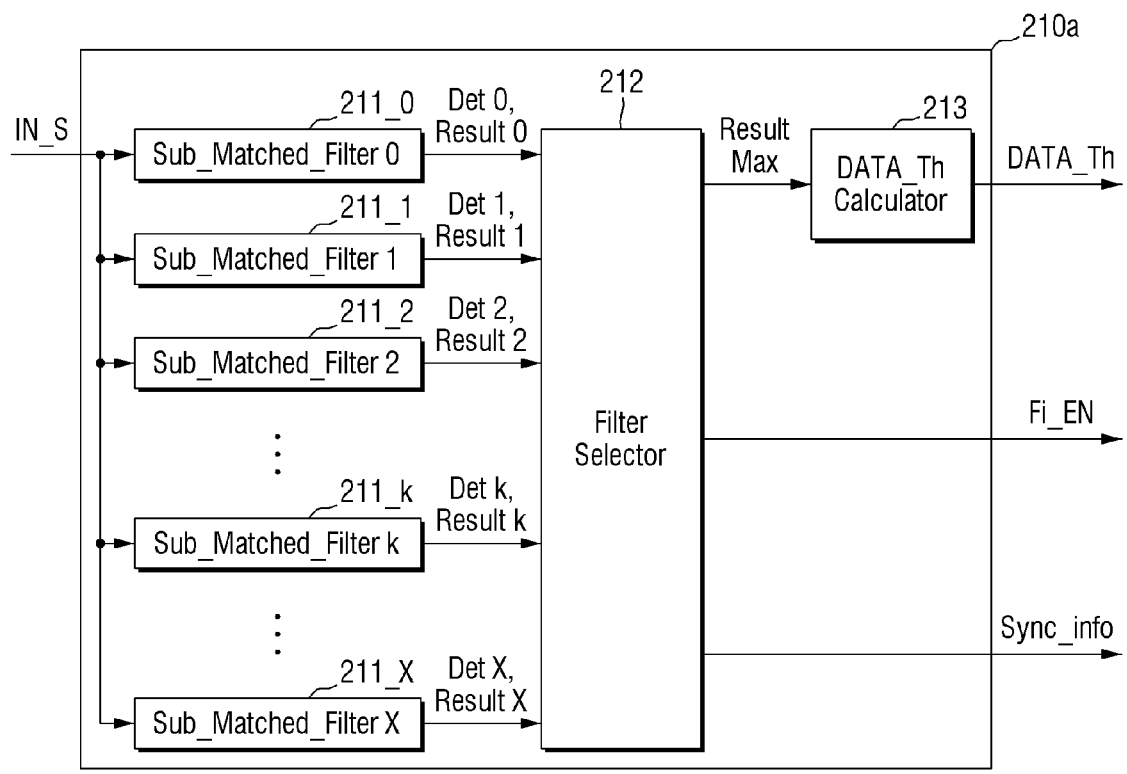
FIG. 4 is a block diagram for explaining a start pattern matched filter of FIG. 3.

FIGS. 2 and 3 are diagrams for explaining an input signal that is input to the NFC device 2. FIG. 4 is a block diagram for explaining a start pattern matched filter 210a of FIG. 3.

For convenience of explanation, the description will be provided on the basis of the NFC device 2 operating in the reception mode. Referring to FIGS. 2 to 4, the NFC device 2 may include an antenna 21, an analog front end 22, an analog-to-digital converter 23, a quadrature demodulator 24, and a modem 25.

The analog front end 22 may receive a reception signal RX_S from the outside (e.g., the tag device 1 of FIGS. 1a and 1b) through the antenna 21. The reception signal RX_S may be a communication signal modulated by a sub-carrier and a carrier in the tag device 1 of FIG. 1, and may be sent in a data frame manner having the form of a data packet. The sub-carrier frequency according to some embodiments may, but are not limited to, correspond to 106 kHz, 212 kHz, 424 kHz, 847 kHz, or the like, depending on the communication protocol to be used.

The analog front end 22 may include a matching network matched to the antenna 21, an attenuator that attenuates the reception signal RX_S received by the antenna 21, a mixer that converts the frequency of the reception signal RX_S to the communication signal of a baseband, a clock generator that provides the clock signal to the mixer, a filter that performs filtering on the communication signal (e.g., a high-pass filter, a band-pass filter, a low-pass filter, and a notch filter), and a variable gain amplifier that amplifies the communication signal by a gain determined to control the amplitude of the communication signal of the baseband. For example, the analog front end 22 may be implemented to perform short-range communication (e.g., NFC) or to perform long-range communication. For example, the antenna may have a coil shape corresponding to the short-range communication or a conductor pattern shape corresponding to the long-range communication.

The analog front end 22 may process the reception signal RX_S to provide an analog output signal I/Q_S. The analog-to-digital converter 23 may sample the analog output signal I/Q_S to generate a sampling signal I/Q_SS, and send it to the quadrature demodulator 24. The quadrature demodulator 24 may generate an input signal IN_S having multiple levels on the basis of the sampling signal I/Q_SS and provide it to the modem 25.

The modem 25 may perform a demodulation operation on the input signal IN_S and may determine reception of a start pattern in the input signal IN_S during the demodulation operation. As illustrated in FIG. 3, the modem 25 may include a start pattern matched filter 210a, a protocol parser 220, a delay cell 230, and a data matched filter 240.

The start pattern matched filter 210a may determine reception of the start pattern through the input signal IN_S. The start pattern matched filter 210a receives the input signal IN_S from the quadrature demodulator 24, receives data type information Type-info of the input signal IN_S from the protocol parser 220, analyzes the start pattern included in the input signal IN_S according to the data type information Type-info, generates a data threshold signal DATA_Th, an enable filter signal Fi_EN, and sync information signal (Sync_info) according to the analyzed result, and provides them to the data matched filter 240.

As illustrated in FIG. 4, the start pattern matched filter 210a may include $0^{th}$ to $X^{th}$ sub-matched filters 211_0 to 211_X, a filter selector 212, and a data threshold calculator 213. Although X according to some embodiments may be a value that is smaller by 1 than a sub-carrier sampling cycle coefficient (SCSC) to be described later, aspects of the present application are not limited to the aforementioned examples.

The $0^{th}$ to $X^{th}$ sub-matched filters 211_0 to 211_X may receive the input signal IN_S and perform a calculation by multiplying the match signal, which are convolution patterns of each of the $0^{th}$ to $X^{th}$ sub-matched filters 211_0 to 211_X, by the input signal IN_S to generate results (Result 0 to Result X). The $0^{th}$ to $X^{th}$ sub-matched filters 211_0 to 211_X may subsequently generate start pattern reception determination signals (Det 0 to Det X) according to the results of the calculation (Result 0 to Result X), and provide the results (Result 0 to Result X) and the start pattern reception determination signals (Det 0 to Det X) to the filter selector 212.

The filter selector 212 generates an enable filter signal Fi_EN and sync information Sync_info on the basis of the results (Result 0 to Result X) and the start pattern reception determination signals (Det 0 to Det X), provides the enable filter signal Fi_EN and the sync information Sync_info to the data matched filter 240, and provides a maximum result value ResultMax to the data threshold calculator 213.

The filter selector 212 selects the maximum result value ResultMax having the maximum value among a plurality of results (Result 0 to Result) X, selects the one of the $0^{th}$ to $X^{th}$ sub-matched filters 211_0 to 211_X corresponding to the maximum result value ResultMax as an enable filter, and provides the enable filter information Fi_EN which is information about the enable filter, and sync information Sync_info about the match signal of the enable filter to the data matched filter 240.

The data threshold calculator 213 calculates the data threshold DATA_Th on the basis of the received maximum result value ResultMax, and provides it to the data matched filter 240. The data threshold DATA_Th according to some embodiments may be determined depending on the maximum result value ResultMax and the data type information Type-info of the input signal IN_S. Although the data threshold calculator 213 according to some embodiments may generate the data threshold DATA_Th by multiplying 1, 1.5, 2, or 4 and the maximum result value ResultMax, aspects of the present invention are not limited to the above-mentioned example of magnification.

As illustrated in FIG. 3, the protocol parser 220 provides the data type information Type-info of the input signal IN_S to both the start pattern matched filter 210a and the data matched filter 240, and sets the data type information of the data matched filter 240 inside the modem 25. The start pattern matched filter 210a and the data matched filter 240 analyze the input signal IN_S on the basis of the data type information Type-info and reads the data in the input signal IN_S.

Although the data type information Type-info may include the sub-carrier frequency, a carrier sampling cycle coefficient (SCSC) which is a ratio of the period of the sub-carrier frequency to the sampling period, and numerical information of the pattern signal included in the start pattern, the data type information Type-info is not limited to the aforementioned examples. In particular, although the carrier sampling cycle coefficient (SCSC) may be at least one of 16 or 32, the example of the carrier sampling cycle coefficient (SCSC) does not limit aspects of the present invention, and may be set to an arbitrary value provided by the software for controlling the protocol parser 220 or the NFC device 2.

The delay cell 230 receives the input signal IN_S, and may delay the time at which the input signal IN_S is input to the data matched filter 240 to correspond to the time at which the start pattern matched filter 210a determines reception of the start pattern. The delay operation may prevent a data loss during the start pattern detection time.

Although the delay cell 230 according to some embodiments delays the input signal IN_S in units of 8/16/32/64 sampling periods and may provide the delayed input signal DEL_S to the data matched filter 240, aspects of the present invention are not limited to the above-mentioned example of the sampling period unit.

The data matched filter 240 may receive the data threshold DATA_Th, the enable filter signal Fi_EN and the sync information Sync_info from the start pattern matched filter 210a, receive the data type information Type-info of the input signal IN_S from the protocol parser 220, and receive the delayed input signal DEL_S from the delay cell 230.

The data matched filter 240 may demodulate the delayed input signal DEL_S on the basis of the data threshold DATA_Th, the enable filter signal Fi_EN, the synch information Sync_info and the data type information Type-info, generate the result data Re_D, and read the data in the input signal IN_S.

Figure 5:
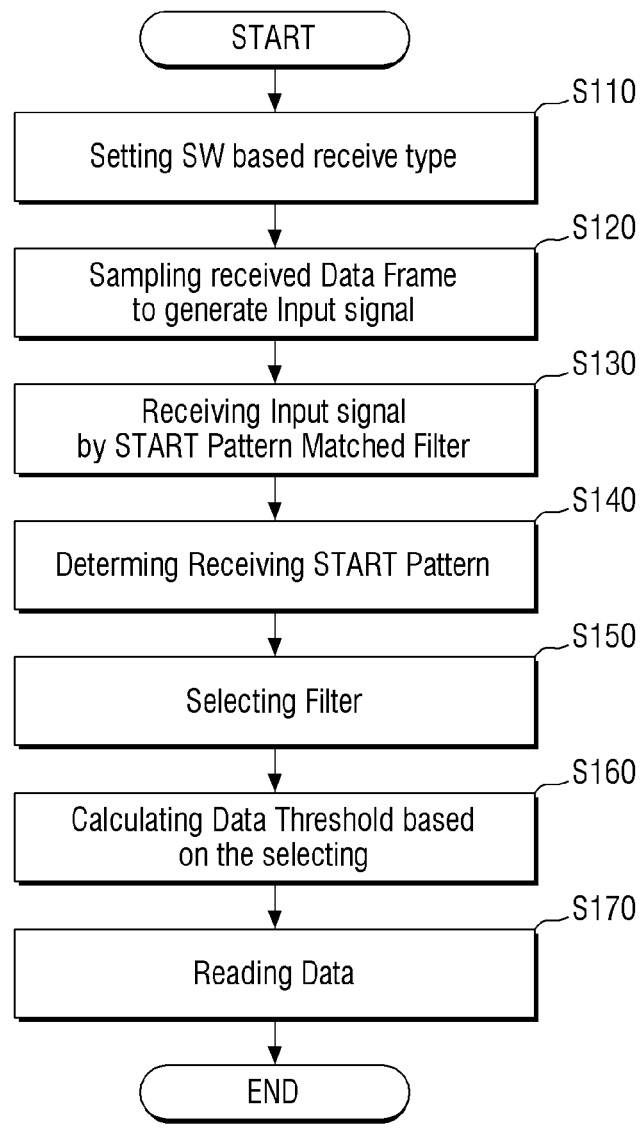
FIG. 5 is a flowchart showing a method of operating the NFC device according to the embodiments of the present invention.

FIG. 5 is a flowchart showing a method of operating the NFC device 2 according to the embodiment of the present invention. FIGS. 6 to 12 are diagrams for explaining a method of operating the NFC device according to the embodiment of the present invention.

Referring to FIG. 5, the protocol parser 220 provides the data type information Type-info to the start pattern matched filter 210a and the data matched filter 240 to set the data type information, on the basis of the data type of the reception signal (RX_S, see FIG. 2) to be received (S110).

As described above, the analog front end 22 may process the reception signal RX_S to provide an analog output signal I/Q_S and the analog-to-digital converter 23 may generate a sampling signal I/Q_SS based on the analog output signal I/Q_S, and send it to the quadrature demodulator 24. The quadrature demodulator 24 generates an input signal IN_S (S120).

Figure 6:
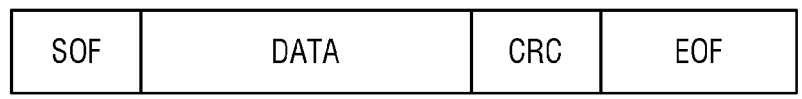
FIGS. 6 to 12 are diagrams for explaining a method of operating the NFC device according to the embodiments of the present invention.
Figure 7:
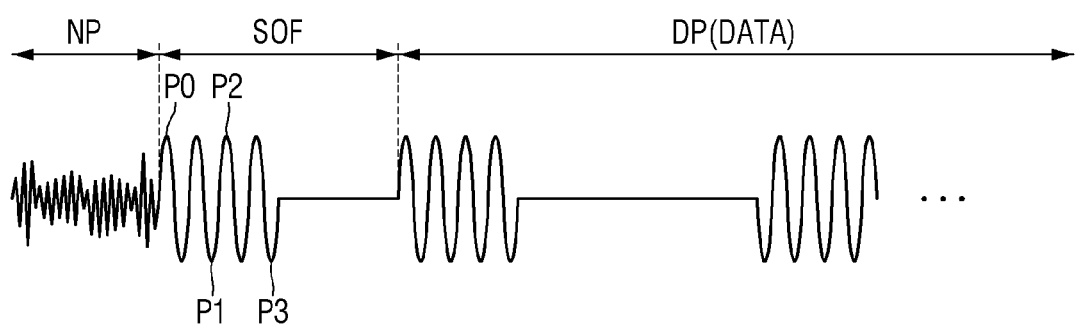

Referring to FIGS. 6 and 7 together, the analog output signal I/Q_S includes a first data frame D1 in the form of a data packet. The first data frame D1 may include a frame start pattern SOF which is a start pattern, the data pattern DATA, an error detection code CRC, and a frame end pattern EOF. The start pattern SOF, the data pattern DATA, the error detection code CRC, and the frame end pattern EOF may be received succeedingly in the time domain.

Although the first data frame D1 may be a data frame used in ISO 14443 type A standard, aspects of the present invention are not limited thereto. The first data frame D1 may be coded in a Manchester code manner and modulated in an OOK (On-Off Key) manner.

The frame start pattern SOF is a pattern indicating the start of the first data frame D1 to be received. The frame start pattern SOF according to some embodiments may include $0^{th}$ to 3rd patterns P0 to P3. Each of the $0^{th}$ to 3rd patterns P0 to P3 has a sub-carrier period (T_sc, FIG. 8) to be described later, and each of the patterns P0 to P3 may correspond to one pulse signal that is input to the NFC device 2. The frequency of the sub-carrier according to some embodiments may be 847 kHz, and the sub-carrier period T_sc may be 1180 ns.

The data pattern DATA may include encoded data. Although data bits of 1 byte unit including 8 bits and parity bits of an odd bit unit may be included, the configuration of the data pattern does not limit aspects of the present invention.

An error detection code CRC is a value calculated from a block of data, such as a data packet being communicated. The error detection code CRC is used to detect an error after reception. The error detection code CRC is calculated and attached to the packet of the first data frame D1 before transmission, and is authenticated later by the reception mode to ensure that there is no change during transmission. Errors of the coded data in the data pattern DATA may be detected through the error detection code CRC. The frame end pattern EOF indicates the end of the first data frame D1.

Figure 8:
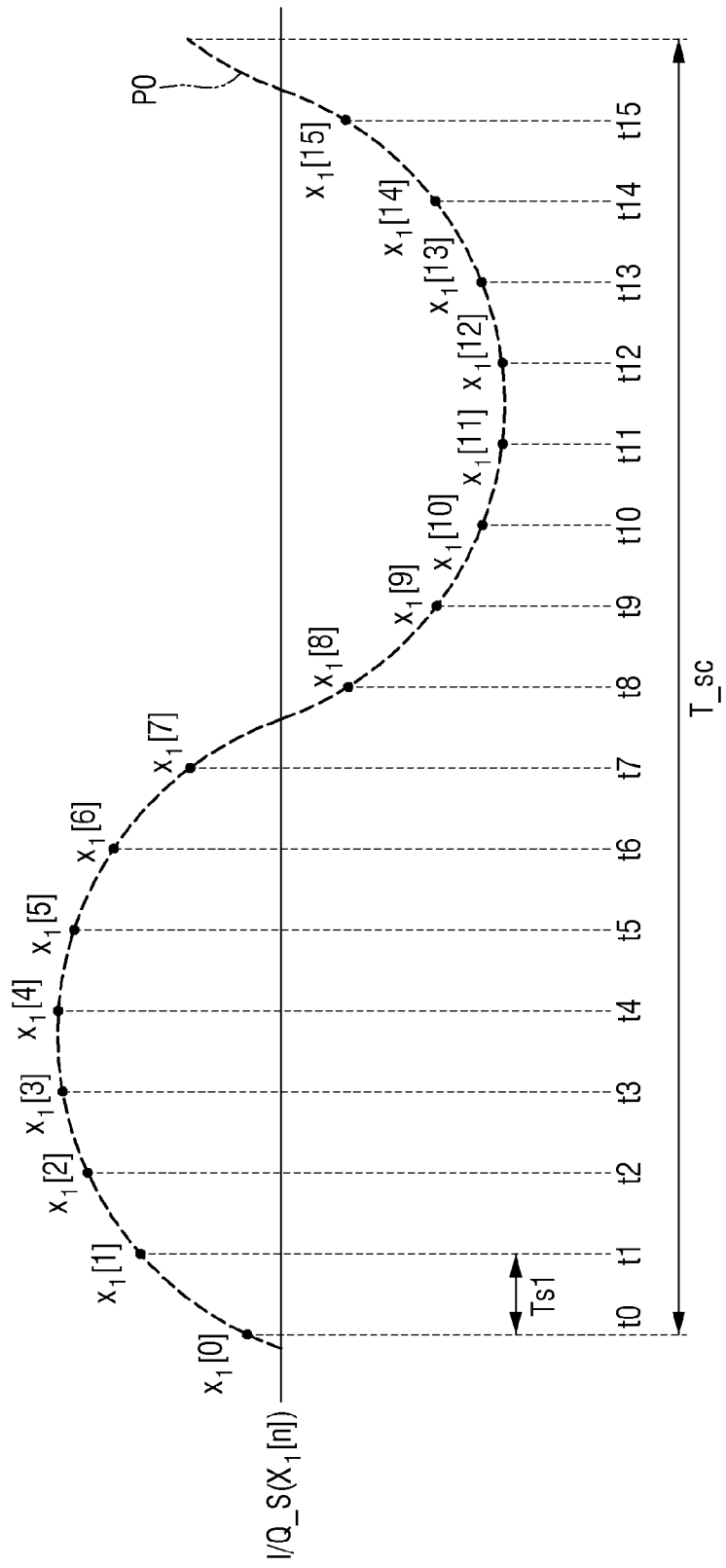

Referring to FIG. 8, for convenience of explanation, the sampling operation of the $0^{th}$ pattern P0 will be described as an example. Subsequently, the sampling operation is also similarly performed on the first to third patterns P1 to P3 that are succeedingly input in the time domain.

The analog-to-digital converter 23 may sample the analog output signal I/Q_S at the first sampling period Ts1 during the sub-carrier period T_sc, and demodulate the sampling result through the quadrature demodulator 24 to generate a first input signal $x_1[n]$ having $0^{th}$ to $15^{th}$ levels $x_i[0$ to $15]$. The sub-carrier period T_sc is 16 times the first sampling period Ts1. As a result, a sub-carrier sampling cycle coefficient (SCSC), which indicates the magnification of the sub-carrier period T_sc and the first sampling period Ts1, is 16.

The start pattern matched filter 210a receives the input signal IN_S (S130), and the start pattern matched filter 210a analyzes the input signal IN_S to determine the reception of the start pattern (S140).

Figure 9:
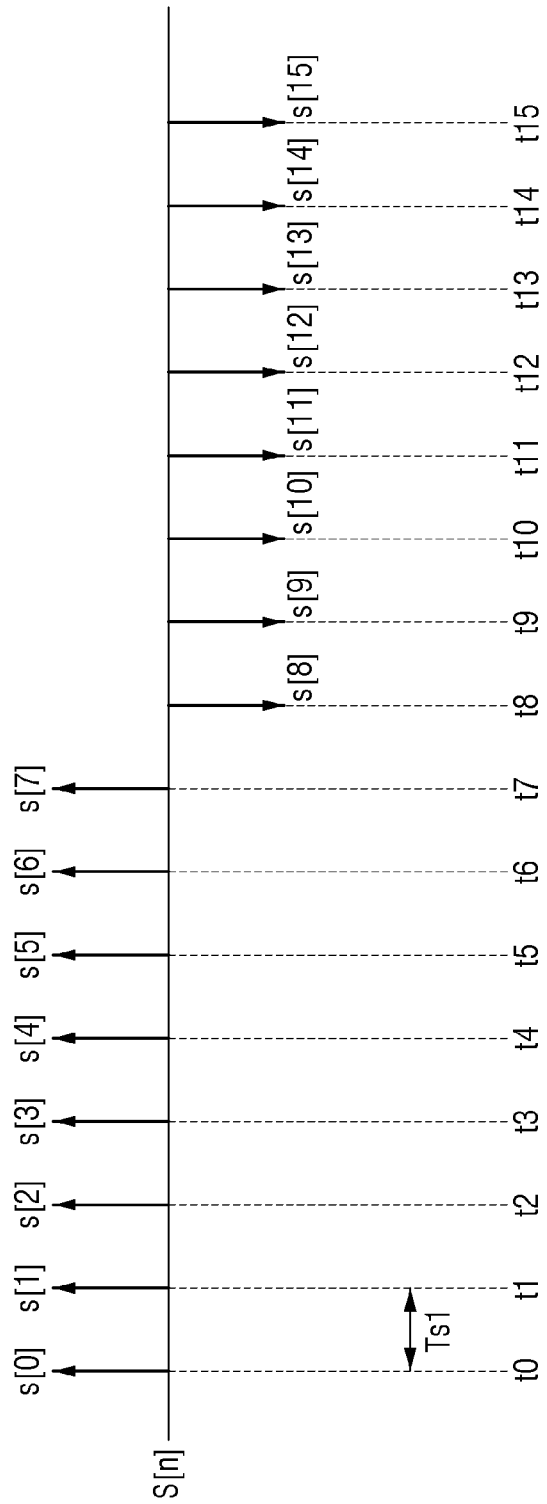
Figure 10:
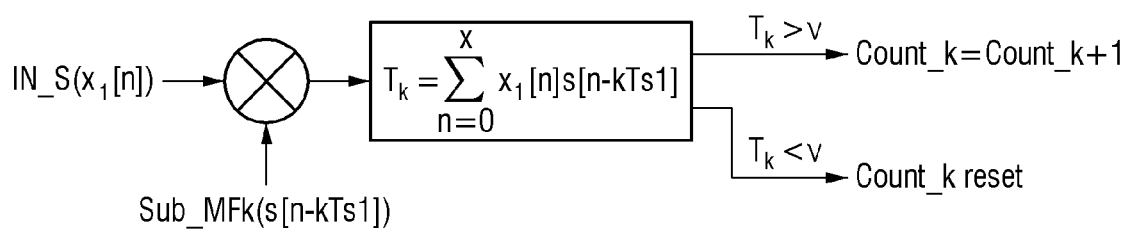
Figure 11:
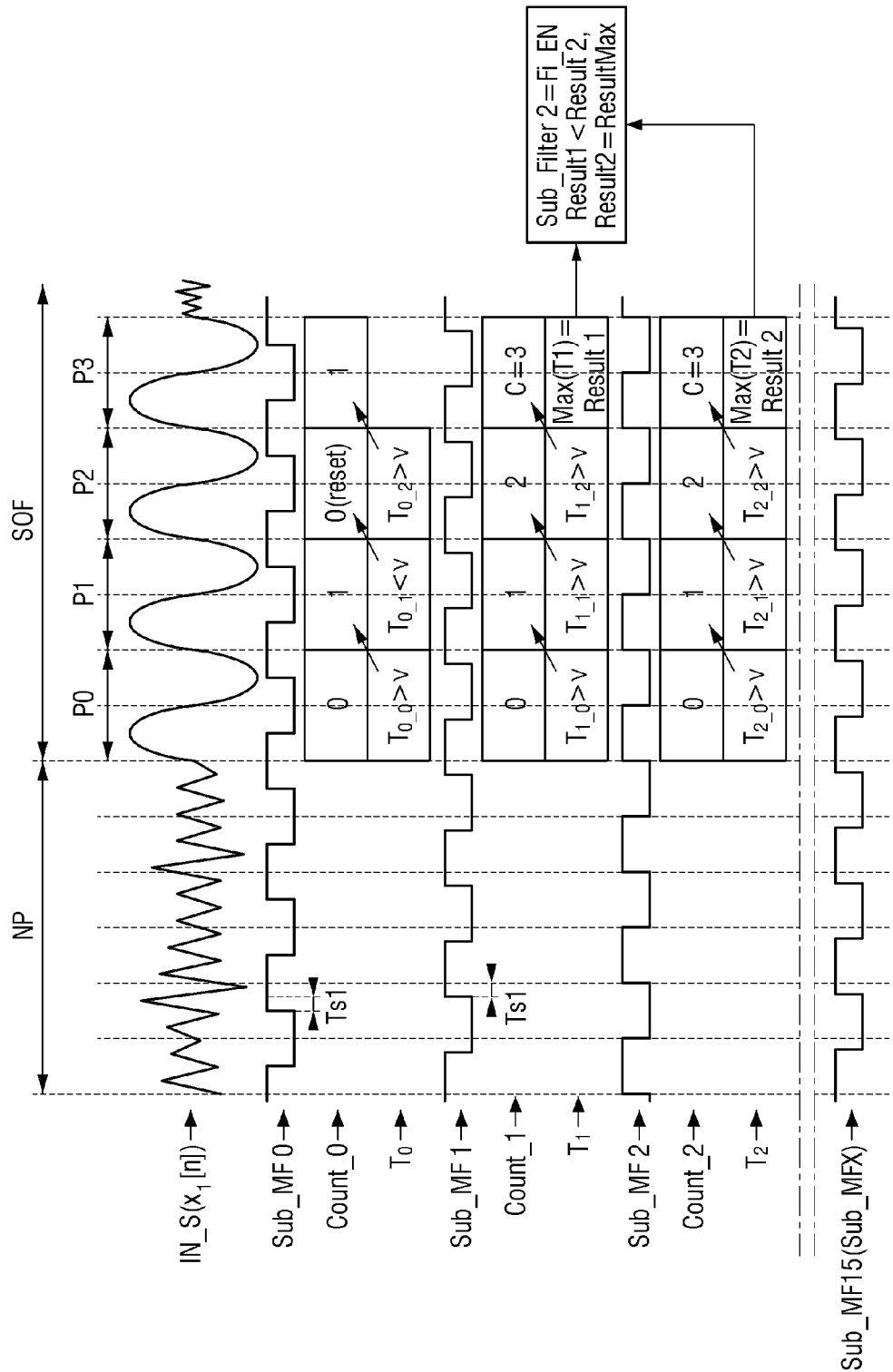

Referring to FIGS. 9 to 11, the operation of a $k^{th}$ sub-matched filter 211_k will be described for convenience of explanation. The operation of the kth sub-matched filter 211_k in FIGS. 9 and 10 is also applied to the remaining sub-matched filters 211_0 to 211_X. X, according to some embodiments, may be a value smaller by 1 than the sub-carrier sampling cycle coefficient (SCSC). For example, X may be 15.

The kth sub-matched filter 211_k receives the first input signal $x_i[n]$ corresponding to the sub-carrier period T_sc, and multiplies the $k^{th}$ match signal Sub_MFk corresponding to the convolution pattern to generate the $k^{th}$ result value $T_k$ as following Equation (1).

$$T_k = \Sigma_{n=0}^{X} x_1[n]s[n-kTs1] \qquad \text{Equation (1)}$$

In the Equation (1), $s[n-kTs1]$ which is the $k^{th}$ match signal Sub_MFk is a signal obtained by shifting the phase of the $0^{th}$ match signal $s[n]$, which is a convolution pattern, by k×first sampling period Ts1.

The $0^{th}$ match signal $s[n]$ has reproducibility at the sub-carrier period T_sc, and the adjacent convolution patterns in the $0^{th}$ match signal $s[n]$ have the first sampling period Ts1. As an example, $0^{th}\_0$ to $0^{th}\_7$ match signals $s[0$ to $7]$ have positive values, and $0^{th}\_8$ to $0^{th}\_15$ match signals $s[8$ to $15]$ have negative values. However, aspects of the present invention is not limited thereto.

The $k^{th}$ sub-matched filter 211_k compares the $k^{th}$ result value $T_k$ with a predetermined start pattern threshold v to increase the $k^{th}$ count count_k whose initial value is 0. When the $k^{th}$ result value $T_k$ exceeds the predetermined start pattern threshold v, the $k^{th}$ result value $T_k$ is increased by 1, and when the $k^{th}$ result value $T_k$ is smaller than the predetermined start pattern threshold v, the $k^{th}$ result value $T_k$ is reset to 0.

The predetermined start pattern threshold v is the same as following Equation (2).

$$\text{Start pattern Threshold } (\gamma) = \frac{V_{max-min} \times SCSC}{4SNR} \qquad \text{Equation (2)}$$

In the Equation (2), the Vmax−min is a difference between a maximum value and a minimum value of the input signal IN_S voltage, and may be, for example, the voltage of the first_4 input signal ($x_1[4]$ see FIG. 8), and the voltage of the first_12 input signal ($x_1[12]$, see FIG. 8). The SCSC is a sub-carrier sampling cycle coefficient, which is a magnification of the period T_sc of the sub-carrier frequency and the first sampling period Ts1. The SNR is a signal-to-noise ratio coefficient for distinguishing a signal/noise specified in advance by the NFC device 2. For example, when the signal-to-noise ratio is 6 dB, the value of SNR is 2, and when the signal-to-noise ratio is 3 dB, the value of SNR is 1.5. However, aspects of the present invention is not limited to the example of the coefficient.

The $k^{th}$ sub-matched filter 211_k also performs the comparison operations after multiplication on the $k^{th}$ result value $T_k$ and the predetermined start pattern threshold v in the first to third patterns P1 to P3, and compares the $k^{th}$ count count_k with the predetermined count threshold C. If the $k^{th}$ count count_k and the predetermined count threshold C are the same, the $k^{th}$ sub-matched filter 211_k provides the filter selector 212 with the $k^{th}$ start pattern reception determination signal (Det k) and the $k^{th}$ result (Result k) which is the maximum value among the $k^{th}$ result values $T_k$, and determines the reception of the start pattern.

The predetermined count threshold C according to some embodiments is a value that is smaller by 1 than the number of patterns in the frame start pattern SOF. As an example, if the frame start pattern SOF has four patterns of signals of the smallest unit, the predetermined count threshold C may be 3. However, aspects of the present application is not limited to that numerical value, and may be a value of 3 or less.

The filter selector 212 selects the sub-matched filter that has the largest value among the provided $0^{th}$ to $X^{th}$ results (Result 0 to Result X) (S150).

Referring to FIG. 11, the operation of the start pattern matched filter 210a will be specifically described, on the basis of the operation of the $0^{th}$ to second sub_matched filters 211_0 to 211_2, the $0^{th}$ sub_matched filter 211_0 calculates a $0^{th}\_0$ result value $T_{0\_0}$ on the $0^{th}$ pattern signal P0, increases the $0^{th}$ count (count_0) by 1, because the $0^{th}\_0$ result value $T_{0\_0}$ exceeds the predetermined start pattern threshold v. After that, the $0^{th}$ sub-matched filter 211_0 calculates the $0^{th}\_1$ result value $T_{0\_1}$ on the first pattern signal P1, and resets the $0^{th}$ count (count_0) to 0, because the $0^{th}\_1$ result value $T_{0\_1}$ is smaller than a predetermined start pattern threshold v. After that, the $0^{th}$ sub_matched filter 211_0 calculates a $0^{th}\_2$ result value $T_{0\_2}$ on the second pattern signal P2, and increases the $0^{th}$ count (count_0) to 1, because the $0^{th}\_2$ result value $T_{0\_2}$ exceeds the predetermined start pattern threshold v. Because the $0^{th}$ count (count_0) is smaller than a predetermined count threshold C, the $0^{th}$ sub_matched filter 211_0 may not determine the reception of the start pattern. Therefore, the $0^{th}$ sub-matched filter 211_0 may not provide the start pattern reception determination signal to the filter selector 212.

The first sub-matched filter 211_1 calculates the first_0 result value $T_{1\_0}$ on the $0^{th}$ pattern signal P0 (first result value of the first match signal), and increases the first count (count_1) by 1 because the first_0 result value $T_{1\_0}$ exceeds a predetermined start pattern threshold v. After that, the first sub-matched filter 211_1 calculates a first_1 result value $T_{1\_1}$ on the first pattern signal P1 (second result value of the first match signal), and increases the first count (count_1) to 2 because the first_1 result value $T_{1\_1}$ exceeds the predetermined start pattern threshold v. After that, the first sub-matched filter 211_1 calculates a first_2 result value $T_{1\_2}$ on the second pattern signal P2 (third result value of the first match signal), and increases the first count (count_1) to 3 because the first_2 result value $T_{1\_2}$ exceeds the predetermined start pattern threshold v. Because the first count (count_1) is the same as 3 which is a predetermined count threshold C, the first sub-matched filter 211_1 provides the filter selector 212 with the first start pattern reception determination signal (Det 1) and the first result (Result 1) which is the maximum value of the first result value $T_1$, and determines the reception of the start pattern of the start pattern matched filter 211.

The second sub-matched filter 211_2 calculates a second_0 result value $T_{2\_0}$ on the $0^{th}$ pattern signal P0 (first result value of the second match signal), and increases the second count (count_2) by 1 because the second_0 result value $T_{2\_0}$ exceeds a predetermined start pattern threshold v. After that, the second sub-matched filter 211_2 calculates a second_1 result value $T_{2\_1}$ on the first pattern signal P1 (second result value of the second match signal), and increases the second count (count_2) to 2 because the second_1 result value $T_{2\_1}$ exceeds a predetermined start pattern threshold v. After that, the second sub-matched filter 211_2 calculates a second_2 result value $T_{2\_2}$ on the second pattern signal P2 (third result value of the second match signal), and increases the second count (count_2) to 3 because the second_2 result value $T_{1\_2}$ exceeds the predetermined start pattern threshold v. Because the second count (count_2) is the same as 3 which is a predetermined count threshold C, the second sub-matched filter 211_2 provides the filter selector 212 with the second start pattern reception determination signal (Det 2) and the second result (Result 2) which is the maximum value of the second result value $T_2$, and determines the reception of the start pattern of the start pattern matched filter 211. In certain aspects of the invention, the first count (count_1) and the second count (count_2) may also be increased when respective result values of the corresponding first match signal and second match signal are equal to the predetermined start pattern threshold v.

The start pattern matched filter 211 may determine the reception of the start pattern through the first and second start pattern reception determination signals Det 1 and Det 2.

After that, the filter selector 212 compares the first result (Result 1) with the second result (Result 2) to generate a maximum result value ResultMax on the basis of the second result (Result 2) which is a larger value, and selects the second sub-matched filter 211_2 corresponding to the second result (Result 2) to generate an enable filter signal Fi_EN and sink information Sync_info.

The data threshold calculator 213 calculates the data threshold DATA_Th on the basis of the maximum result value ResultMax provided by the selection (S160). The data threshold DATA_Th according to some embodiments may be determined depending on the maximum result value ResultMax and the data type information Type-info of the input signal IN_S.

The data threshold calculator 213 provides the data matched filter 240 with the data threshold DATA_Th, and the data matched filter 240 reads the data on the basis of the data threshold DATA_Th (S170).

Figure 12:
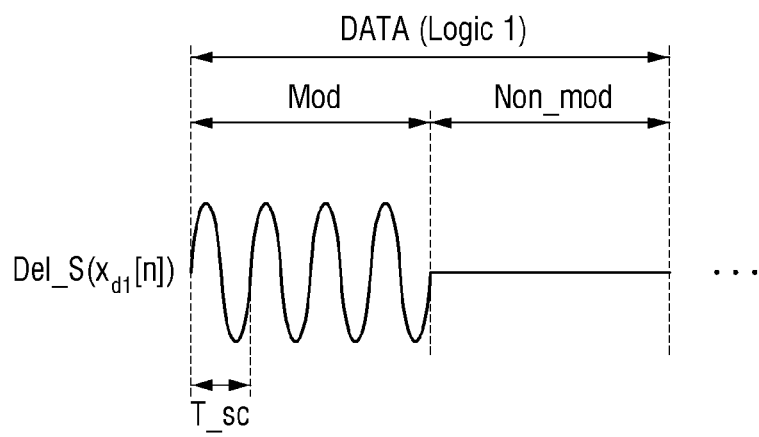

Referring to FIG. 12 together, the data matched filter 240 multiplies the data match signal s[n−$k_{sync}$Ts1] generated through the sync information Sync_info by the delayed input signal DEL_S to perform the calculation as shown in following Equation 3, and compares the following calculation result with the data threshold DATA_Th to read the data.

$$\Sigma_{n=0}^{4X+3} x_{d1}[n]s[n-k_{sync}Ts1] \qquad \text{Equation (3)}$$

The data threshold DATA_Th may be influenced by the number of patterns in a modulation interval Mod, a coding type and a modulation form. If the number of patterns in the modulation interval Mod is 4, when the data threshold DATA_Th is twice the maximum result value ResultMax, the data may be stably read. However, aspects of the present invention is not limited thereto, and the data threshold DATA_Th may be a value obtained by multiplying any multiple provided by the software for controlling the protocol parser 220 or the NFC device 2 by the maximum result value ResultMax.

When the modulation interval Mod precedes a non-modulation interval Non-Mod as shown in the drawing, the calculation result of Equation (3) exceeds the data threshold DATA_Th, and the data matched filter 240 reads the logic of the data DATA as 1. In contrast, when the modulation interval Mod follows the non-modulation interval Non-Mod, the calculation result of the Equation (3) is smaller than the data threshold DATA_Th, and the data matched filter 240 reads the logic of the data DATA as 0.

Figure 13:
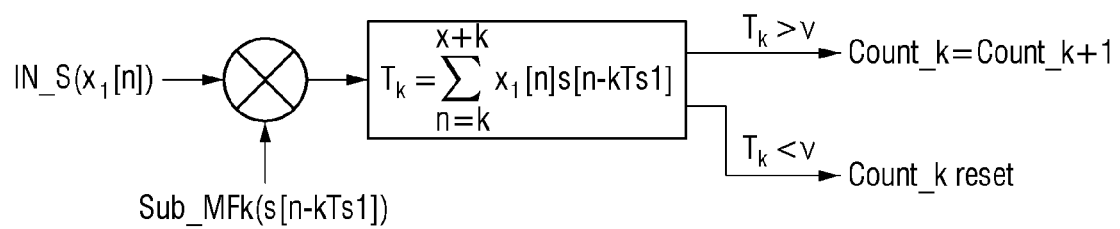
FIGS. 13 and 14 are diagrams for explaining a method of operating the NFC device according to other embodiments of the present invention.
Figure 14:
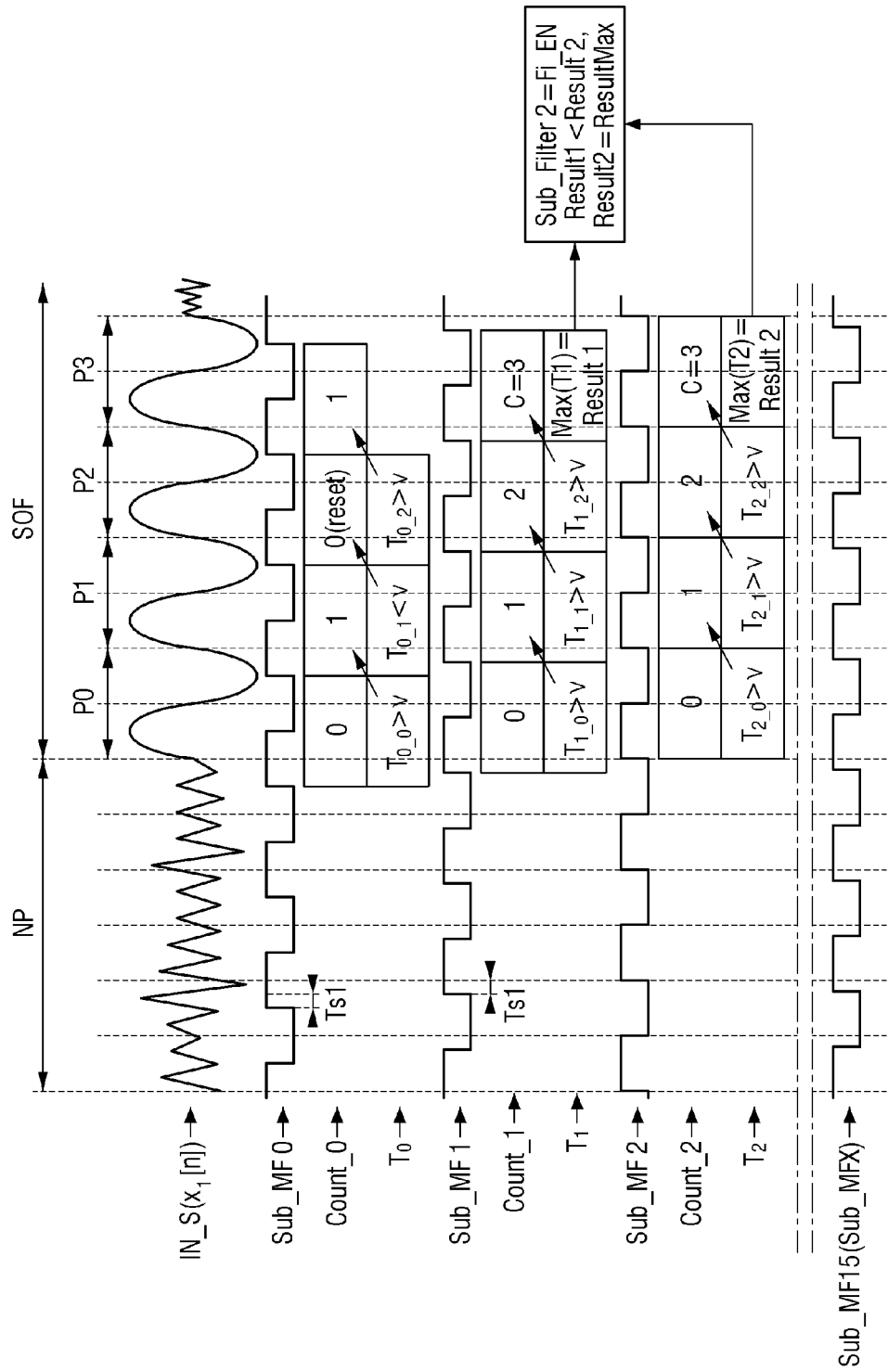
Figure 16:
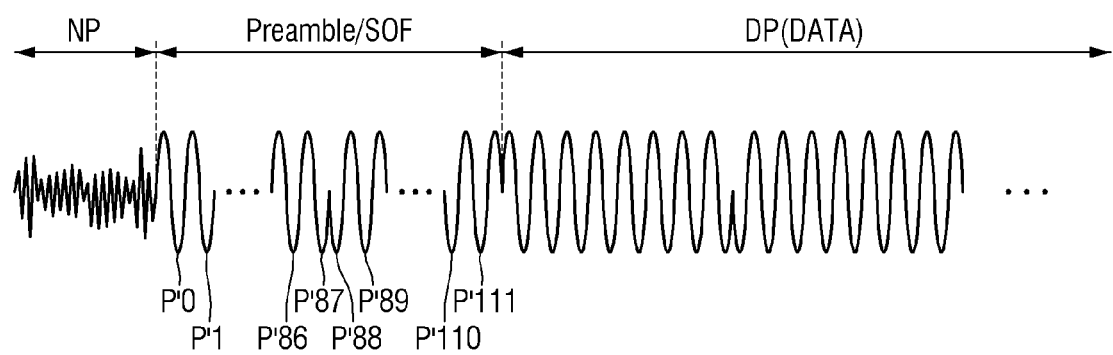
Figure 17:
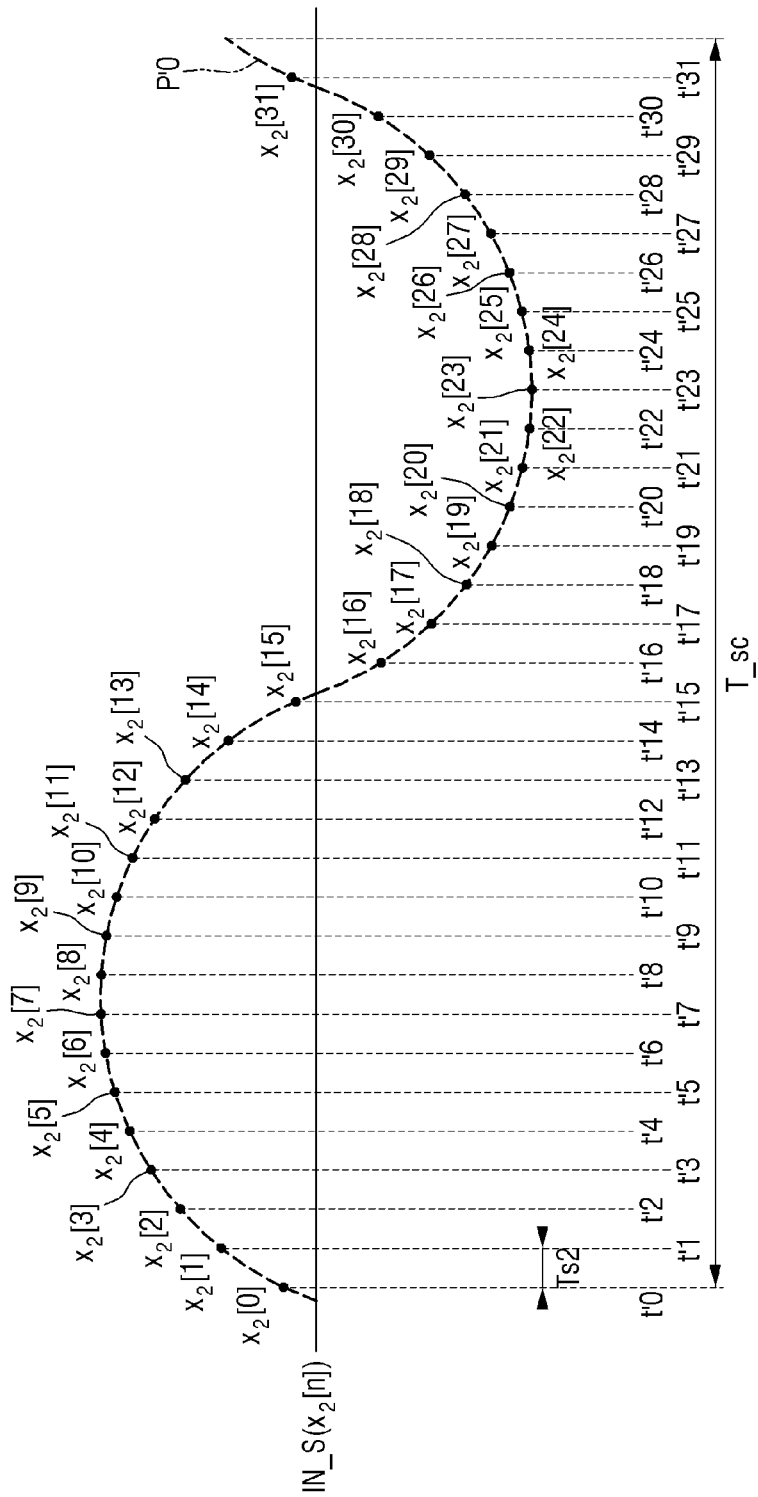
Figure 18:
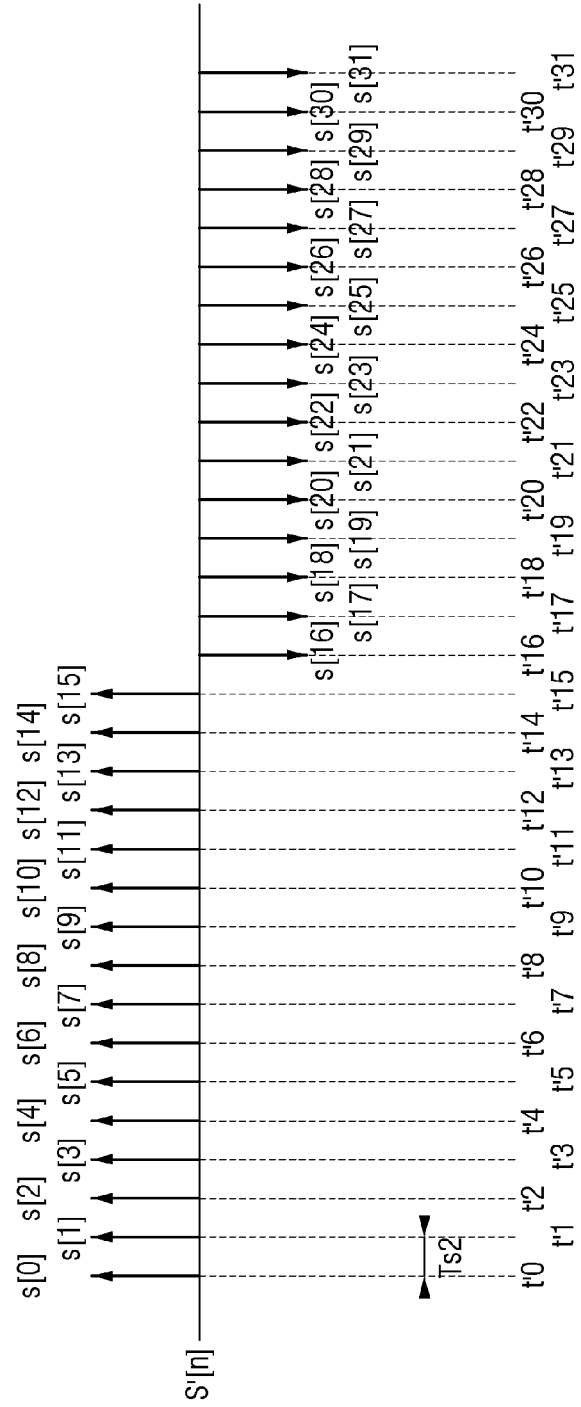
Figure 19:
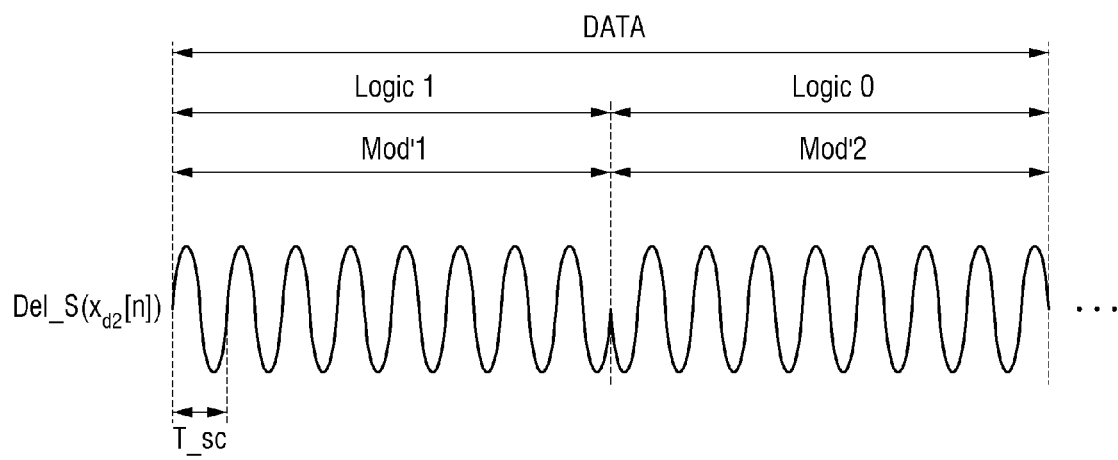
Figure 20:
FIGS. 20 to 24 are diagrams for explaining a method of operating the NFC device according to still other embodiments of the present invention.
Figure 21:
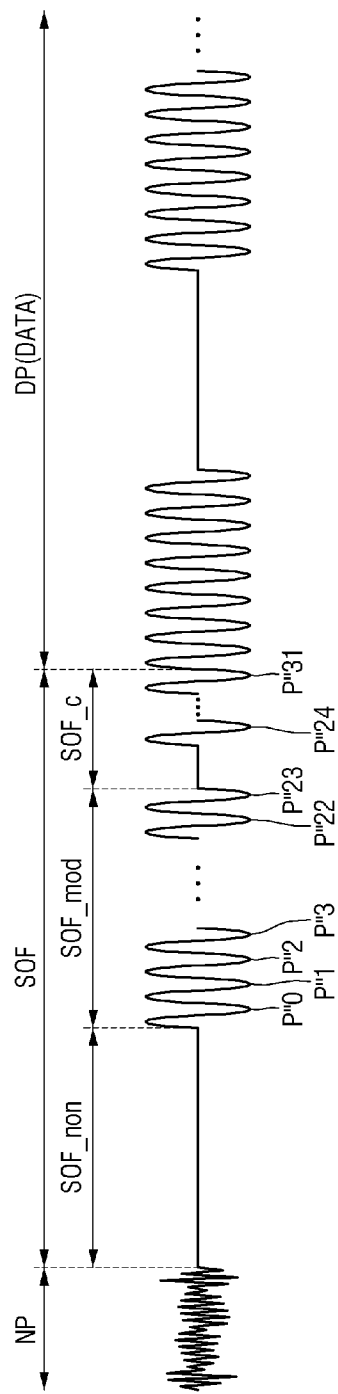
Figure 22:
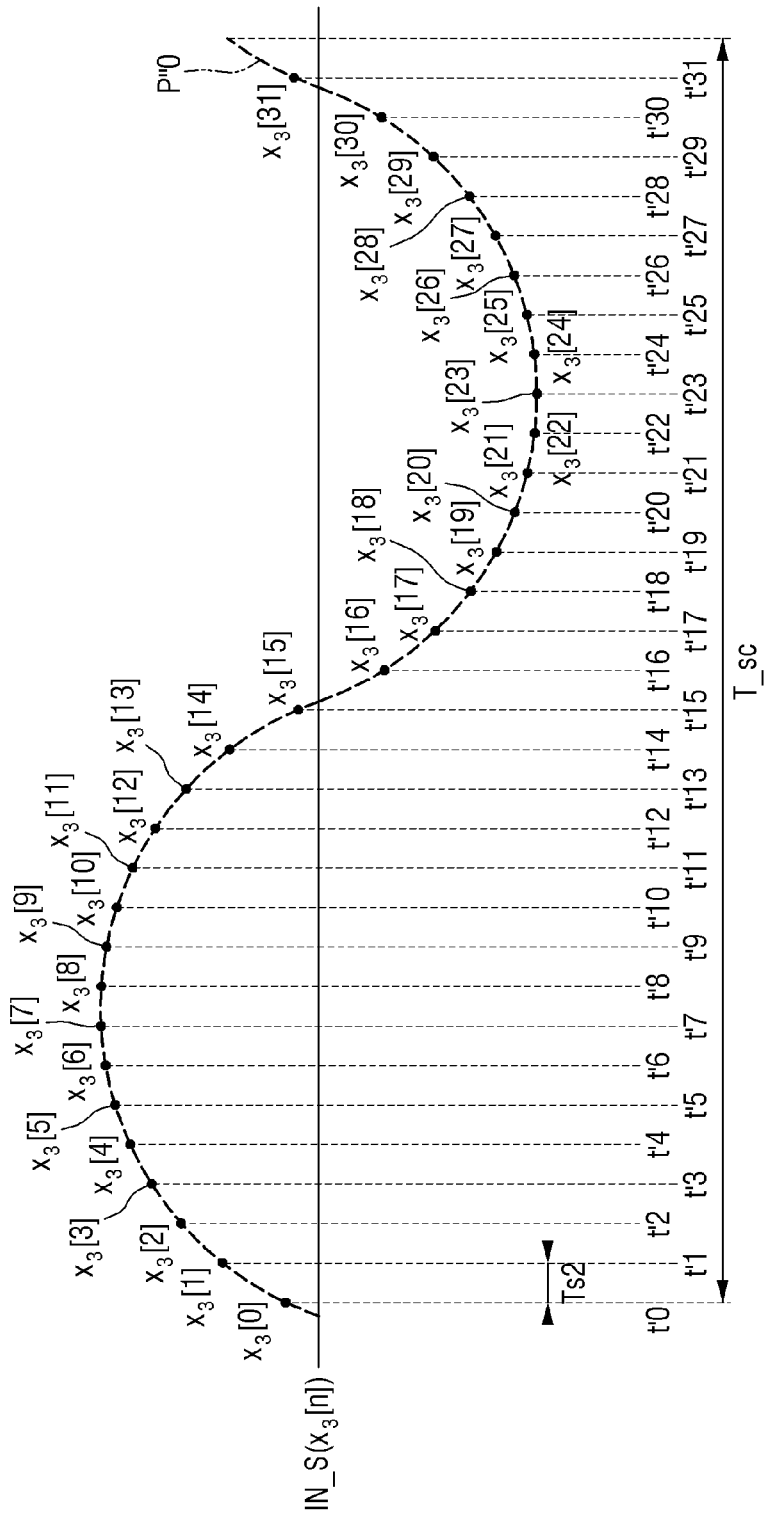
Figure 23:
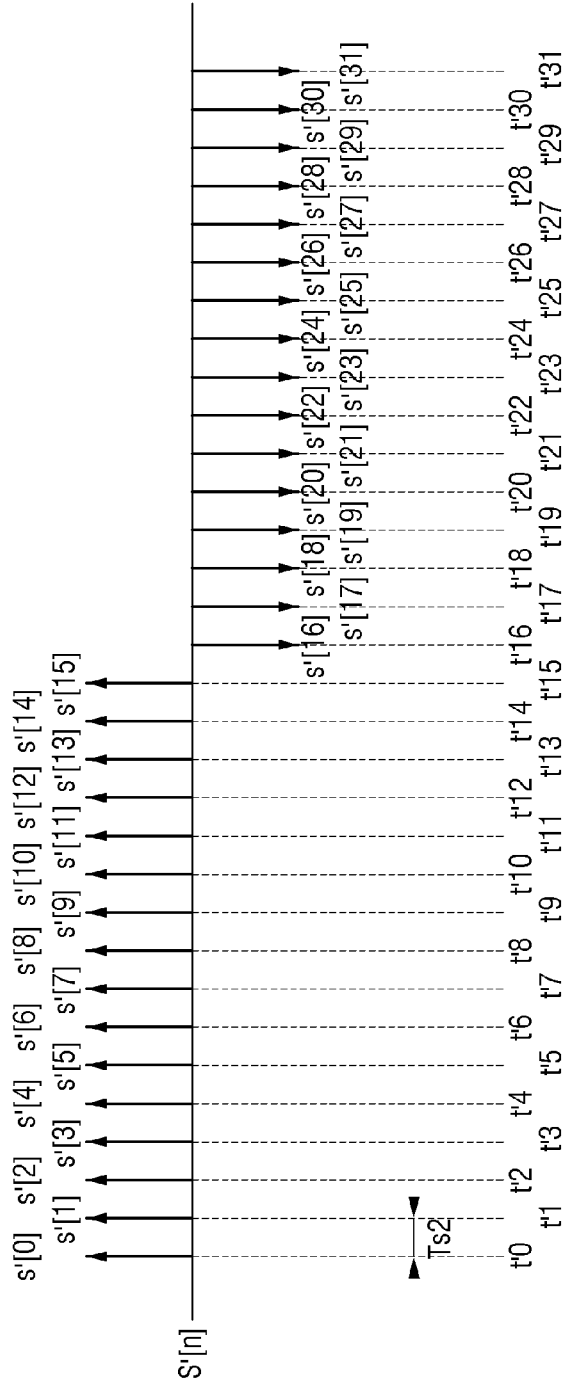
Figure 24:
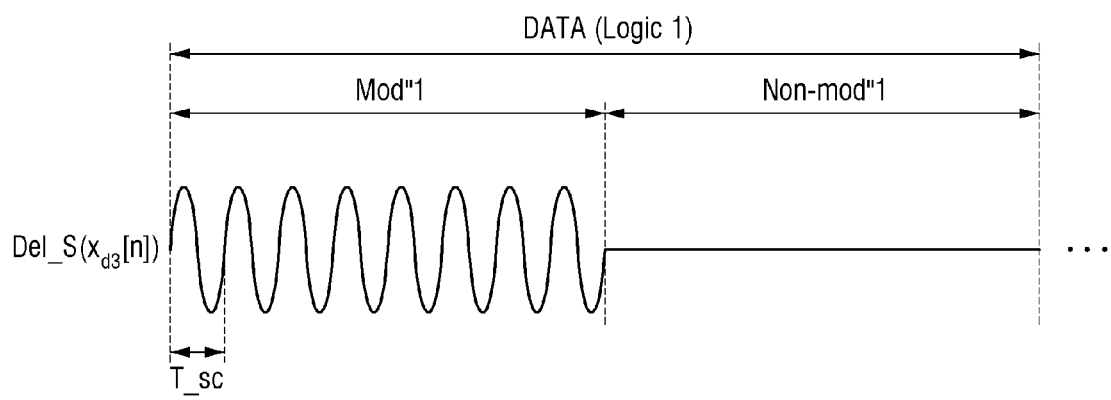
Figure 26:
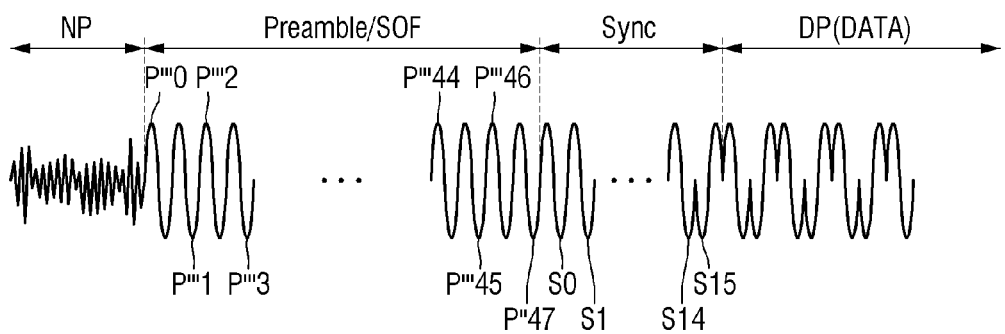
Figure 27:
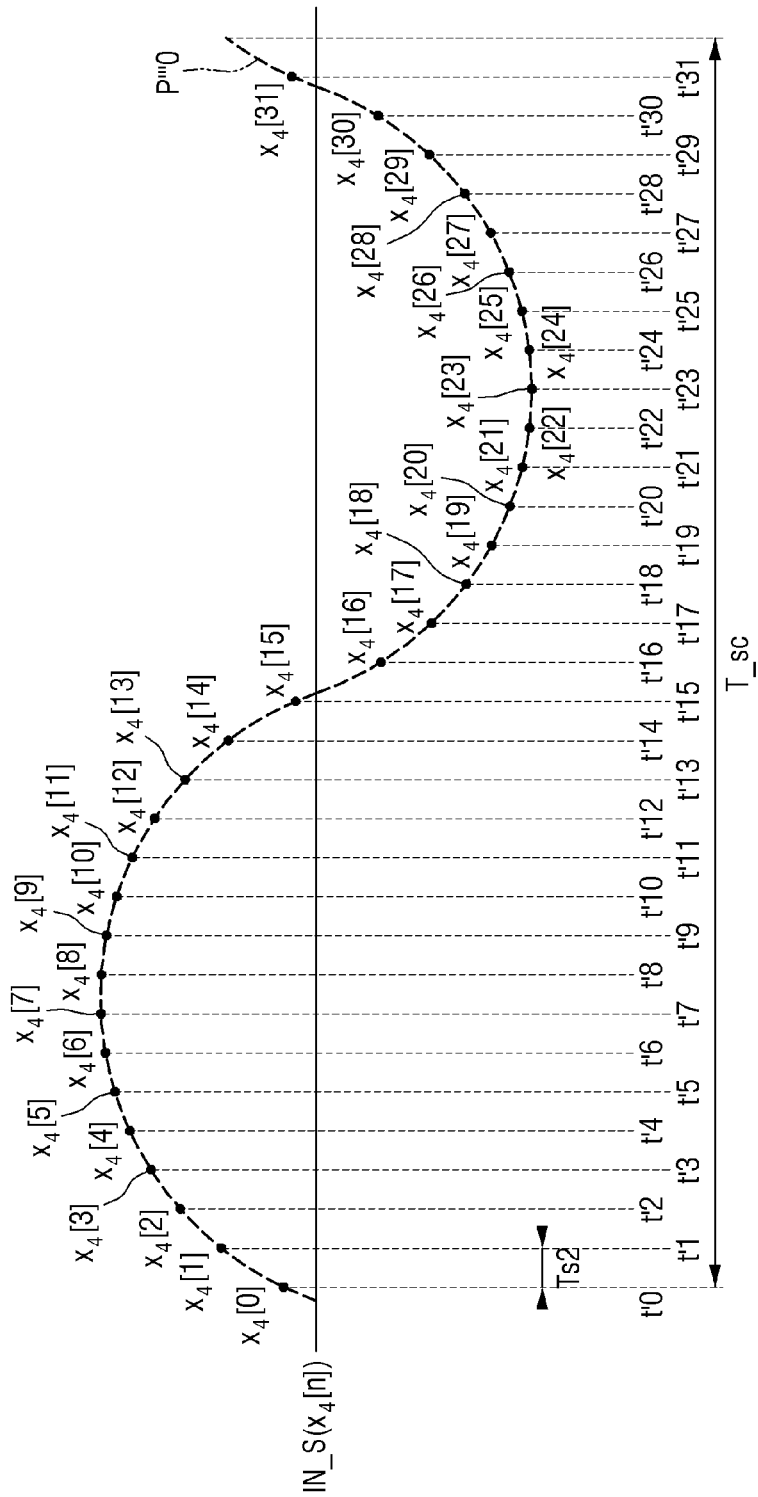
Figure 28:
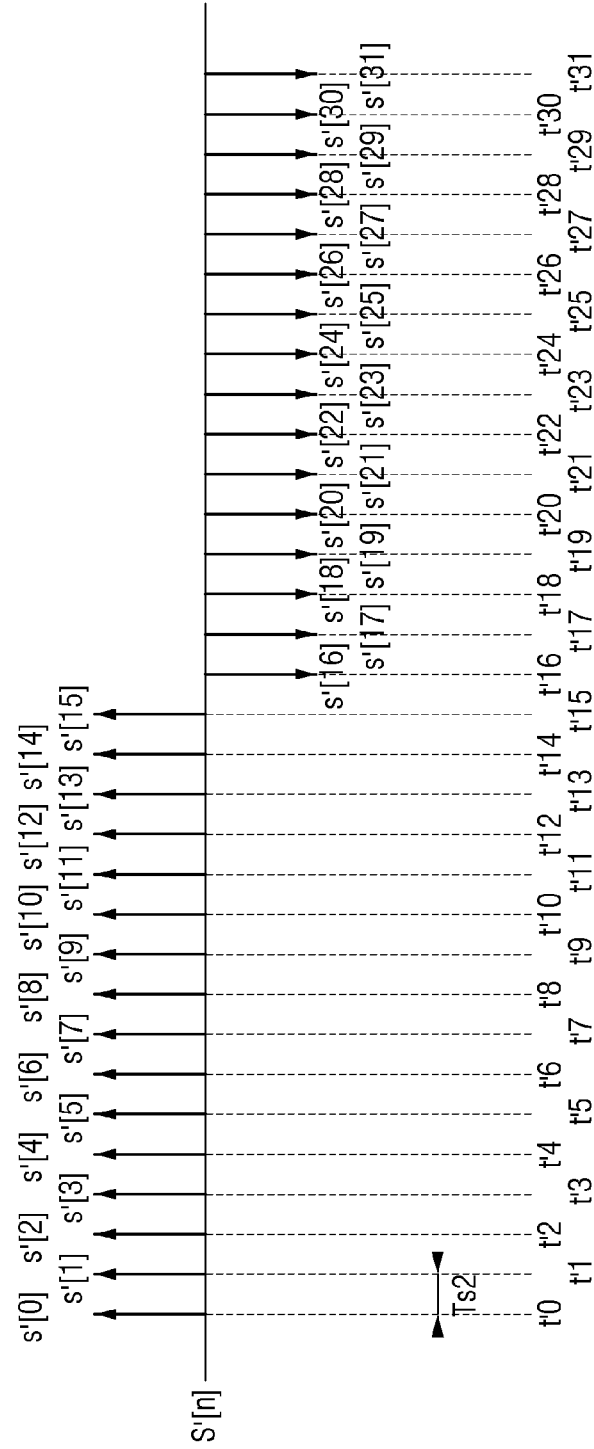
Figure 29:
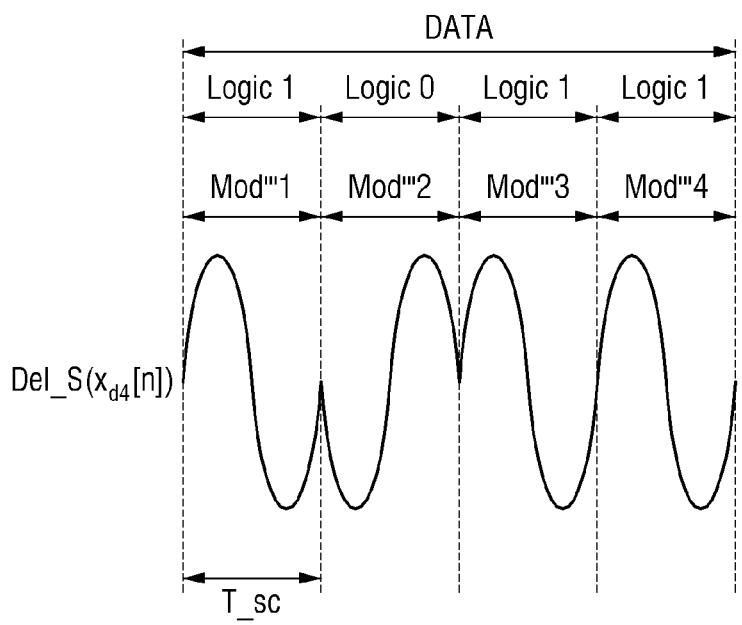

FIGS. 13 to 14 are diagrams for explaining a method of operating the NFC device according to other embodiments of the present invention. For convenience of explanation, points different from those described using FIGS. 10 to 11 will be mainly described.

Referring to FIGS. 13 and 14, the $0^{th}$ to $X^{th}$ sub-matched filters 211_0 to 211_X do not operate collectively at the same time, but operate in accordance with a phase of each input match signal. The operation of each of the $0^{th}$ to $X^{th}$ sub-matched filters 211_0 to 211_X may be delayed in units of the first sampling period Ts1.

Therefore, the $k^{th}$ sub-matched filter 211_$k$ receives the first input signal $x_1[n]$ corresponding to the sub-carrier period T_sc on the basis of the $k^{th}$ match signal Sub_MFk, and multiplies the $k^{th}$ match signal Sub_MFk to generate the $k^{th}$ result value $T_k$ as shown in following Equation (4).

$$T_k = \Sigma_{n=k}^{X+k} x_1[n] s[n-kTs1] \quad \text{Equation (4)}$$

The start pattern matched filter 210a performs the operation of the step (S140) on the basis of the $k^{th}$ result value $T_k$ generated by the Equation (4).

FIGS. 15 to 19 are diagrams for explaining a method of operating the NFC device according to still other embodiments of the present invention. For convenience of explanation, points different from those described using FIGS. 6 to 12 will be mainly described.

Referring to FIGS. 15 to 19, the analog output signal I/Q_S includes a second data frame D2 in the form of a data packet. The second data frame D2 may include a preamble/frame start pattern SOF which is a start pattern, a data pattern DATA, an error detection code CRC, and a frame end pattern EOF. The preamble/frame start pattern SOF, the data pattern DATA, the error detection code CRC and the frame end pattern EOF may be received succeedingly in the time domain.

Although the second data frame D2 may be a data frame used in an ISO 14443 type B standard, aspects of the present invention is not limited thereto. The second data frame D2 is coded in a NRZ-L (Non-return-to-zero level) manner, and modulated in a binary phase shift keying (BPSK) manner.

The preamble/frame start pattern SOF is a pattern indicating the start of the second data frame D2 to be received. The preamble/frame start pattern SOF according to some embodiments may include $0^{th}$ to $111^{th}$ patterns P'0 to P'111.

Each of the $0^{th}$ to $111^{th}$ patterns P'0 to P'111 according to some embodiments has one elementary time unit on the basis of eight patterns. Further, each of the patterns P'0 to P'111 may correspond to one pulse signal which has a sub-carrier period T_sc and is input to the NFC device 2. The frequency of the sub-carrier according to some embodiments may be 847 kHz, and the sub-carrier period T_sc may be 1180 ns.

As shown in the drawings, the preamble/frame start pattern SOF to be input according to some embodiments may include, but are not limited to, $0^{th}$ to $87^{th}$ P'0 to P'87 and $88^{th}$ to $111^{th}$ patterns P'88 to P'111 that have phases opposite to each other.

At step S120, the analog-to-digital converter 23 may sample the analog output signal I/Q_S at the second sampling period Ts2 during the sub-carrier period T_sc, and demodulate the sampling result through the quadrature demodulator 24 to generate a second input signal $x_2[n]$ having a $0^{th}$ to $31^{st}$ level $x_2[0$ to $31]$. The sub-carrier period T_sc is 32 times the second sampling period Ts2. As a result, the sub-carrier sampling cycle coefficient (SCSC), which indicates the magnification of the sub-carrier period T_sc and the second sampling period Ts2, is 32.

At steps S130 and S140, the $0^{th}$ to $X^{th}$ sub-matched filters 211_0 to 211_X may determine reception of the start pattern on the basis of the $0^{th}$ match signal s'[n]. The $0^{th}$ match signal s'[n] has repeatability at the sub-carrier period T_sc, and adjacent convolution patterns in the $0^{th}$ match signal s[n] has the second sampling period Ts2. As an example, the $0^{th}$_0 to $0^{th}$_15 match signals s[0 to 15] have positive values, and the $0^{th}$_15 to $0^{th}$_31 match signals s[15 to 31] have negative values. However, aspects of the present application is not limited thereto. X according to some embodiments may be a value smaller by 1 than the sub-carrier sampling cycle coefficient (SCSC), and X may be 31.

Further, since the number of pattern signals in the start pattern of the second data frame D2 is eight, the predetermined count threshold C may be 7.

At steps S160 and S170, the data matched filter 240 multiplies the data match signal s'[n-$k_{sync}$Ts2] generated through the sync information Sync_info by the delayed input signal DEL_S to perform the calculation as shown in following Equation (5), and compares the following calculation result with the data threshold DATA_Th to read the data.

$$\Sigma_{n=0}^{8X+7} x_{d2}[n] s'[n-k_{sync}Ts2] \quad \text{Equation (5)}$$

The data threshold DATA_Th may be influenced by the number of patterns in the modulation interval Mod'1, the coding type and the modulation form, and if all intervals of the data are modulation intervals Mod'1 and Mod'2, when the data threshold DATA_Th is the same as the maximum result value ResultMax, the data may be stably read. However, aspects of the present invention is not limited thereto, and the data threshold DATA_Th may be a value obtained by multiplying any multiple provided by the software for controlling the protocol parser 220 or the NFC device 2 by the maximum result value ResultMax.

When the phase is modulated to 0° as shown in the drawings, the calculation result of the Equation (5) exceeds the data threshold DATA_Th, and the data matched filter 240 reads the logic of that data DATA as 1. In contrast, when the phase is modulated to 180°, the calculation result of the Equation (5) is smaller than the data threshold DATA_Th, and the data matched filter 240 reads the logic of the data DATA as 0.

FIGS. 20 to 24 are diagrams for explaining a method of operating the NFC device according to still other embodiments of the present invention. For convenience of explanation, points different from those described using FIGS. 6 to 12 will be mainly described.

Referring to FIGS. 20 to 24, the analog output signal I/Q_S includes a third data frame D3 in the form of a data packet. The third data frame D3 may include a frame start pattern SOF which is a start pattern, a data pattern DATA, an error detection code CRC and a frame end pattern EOF. The frame start pattern SOF, the data pattern DATA, the error detection code CRC, and the frame end pattern EOF may be received succeedingly in the time domain.

Although the third data frame D3 may be a data frame used in an ISO 15693 standard, aspects of the present invention is not limited thereto. The first data frame D1 is coded in Manchester code and modulated in an OOK (On-Off Key) manner.

The frame start pattern SOF is a pattern indicating the start of the received third data frame D3. The frame start pattern SOF according to some embodiments may include $0^{th}$ to $31^{st}$ patterns P"0 to P"31. Although the frame start pattern SOF according to some embodiments may include a start non-modulation interval SOF_non, a start modulation interval SOF_mod, and a start mixed interval SOF_c, aspects of the present application is not limited to the aforementioned examples. The start modulation interval SOF_mod includes $0^{th}$ to $23^{rd}$ patterns P'''0 to P'''23, and the start non-modulation interval SOF_non and the start modulation interval SOF_mod may have the same time interval. The start mixed interval SOF_c includes $24^{th}$ to $31^{st}$ patterns P'''24 to P'''31, and the start mixed interval SOF_c may have a shorter time interval than the start modulation interval SOF_mod.

The frequency of the sub-carrier according to some embodiments may be 212 kHz or 424 kHz, and the sub-carrier period T_sc may be 4717 ns or 2359 ns accordingly.

At step S120, the analog-to-digital converter 23 may sample the analog output signal I/Q_S at the second sampling period Ts2 during the sub-carrier period T_sc, and demodulate the sampling result through the quadrature demodulation 24 to generate a third input signal $x_3[n]$ having $0^{th}$ to $31^{st}$ levels $x_3[0$ to $31]$. The sub-carrier period T_sc is 32 times the second sampling period Ts2. Accordingly, the sub-carrier sampling cycle coefficient (SCSC), which indicates the magnification of the sub-carrier period T_sc and the second sampling period Ts2, is 32.

At steps S130 and S140, the $0^{th}$ to $X^{th}$ sub-matched filters 211_0 to 211_X may determine reception of the start pattern on the basis of the $0^{th}$ match signal s'[n]. The $0^{th}$ match signal s'[n] has repeatability at the sub-carrier period T_sc, and the adjacent convolution patterns in the $0^{th}$ match signal s[n] has the second sampling period Ts2. As an example, the $0^{th}\_0$ to $0^{th}\_15$ match signals s[0 to 15] have positive values, and the $0^{th}\_15$ to $0^{th}\_31$ match signals s[15 to 31] have negative values. However, aspects of the present application is not limited thereto. X according to some embodiments may be a value smaller by 1 than the sub-carrier sampling cycle coefficient (SCSC), and X may be 31.

Further, since the number of pattern signals in the start pattern of the third data frame D3 is eight, the predetermined count threshold C may be 7.

At steps S160 and S170, the data matched filter 240 multiplies a data match signal s'[n–$k_{sync}$Ts2] generated through the sync information Sync_info by the delayed input signal DEL_S to perform the calculation as shown in following Equation (6), compares the calculation result with the data threshold DATA_Th to read the data.

$$\Sigma_{n=0}^{8X+7} x_{d3}[n]s'[n-k_{sync}Ts2] \qquad \text{Equation (6)}$$

The data threshold DATA_Th may be influenced by the number of patterns in the modulation interval Mod''1, the coding type and the modulation form. If the number of patterns in the modulation interval Mod''1 is eight, when the data threshold DATA_Th is 4 times the maximum result value ResultMax, the data may be stably read. However, aspects of the present invention is not limited thereto, and the data threshold DATA_Th may be a value obtained by multiplying any multiple provided by the software for controlling the protocol parser 220 or the NFC device 2 by the maximum result value ResultMax.

When the modulation interval Mod'' precedes the non-modulation interval Non-Mod'' as shown in the drawing, the calculation result of the Equation (3) exceeds the data threshold DATA_Th, and the data matched filter 240 reads the logic of the data DATA as 1. In contrast, when the modulation interval Mod follows the non-modulation interval Non-Mod, the calculation result of the Equation (6) is smaller than the data threshold DATA_Th, and the data matched filter 240 reads the logic of that data DATA as 0.

FIGS. 25 to 29 are diagrams for explaining a method of operating the NFC device according to still other embodiments of the present invention. For convenience of explanation, points different from those described using FIGS. 6 to 12 will be mainly described.

Referring to FIGS. 25 to 29, the analog output signal I/Q_S includes a fourth data frame D4 in the form of a data packet. The fourth data frame D4 may include a preamble, which is a start pattern, a sync, a length pattern, a data pattern DATA, and an error detection code CRC. The preamble, the sync, the length pattern, the data pattern DATA and the error detection code CRC may be received succeedingly in the time domain.

Although the fourth data frame D4 may be a data frame used in a Felica standard, aspects of the present invention is not limited thereto. The second data frame D4 is coded in a NRZ-L (Non-return-to-zero level) manner and modulated in a binary phase shift keying (BPSK) manner.

The preamble is a pattern that indicates the start of the received fourth data frame D4. The preamble according to some embodiments may include $0^{th}$ to $47^{th}$ patterns P''''0 to P''''47. Each of the $0^{th}$ to $47^{th}$ patterns P''''0 to P''''47 has a sub-carrier period T_sc. The frequency of the sub-carrier according to some embodiments may be 424 kHz, and the sub-carrier period T_sc may be 2359 ns.

The sync is a pattern that follows the preamble and may include pre-specified data, and may include 16-bit data of 16'B24D as an example. However, aspects of the present invention is not limited thereto.

The length pattern (length) is a pattern indicating the length of the fourth data frame D4. The modem 25 ends the data read operation in the fourth data frame D4 in consideration of the length pattern (length).

At step S120, the analog-to-digital converter 23 may sample the analog output signal I/Q_S at the second sampling period Ts2 during the sub-carrier period T_sc, and demodulate the sampling result through the quadrature demodulator 24 to generate a fourth input signal $x_4[n]$ having $0^{th}$ to $31^{st}$ level $x^4[0$ to $31]$. The sub-carrier period T_sc is 32 times the second sampling period Ts2. Accordingly, the sub-carrier sampling cycle coefficient (SCSC), which indicates the magnification of the sub-carrier period T_sc and the second sampling period Ts2, is 32.

At steps S130 and S140, the $0^{th}$ to $X^{th}$ sub-matched filters 211_0 to 211_X may determine reception of the start pattern on the basis of the $0^{th}$ match signal s'[n]. The $0^{th}$ match signal s'[n] has repeatability at the sub-carrier period T_sc, and the adjacent convolution patterns in the $0^{th}$ match signal s[n] has a second sampling period Ts2. As an example, the $0^{th}\_0$ to $0^{th}\_15$ match signals s[0 to 15] have positive values, and the $0^{th}\_15$ to $0^{th}\_31$ match signals s[15 to 31] have negative values. However, aspects of the present application is not limited thereto. X according to some embodiments may be a value smaller by 1 than the sub-carrier sampling cycle coefficient (SCSC), and X may be 31.

Further, since the number of pattern signals in the start pattern of the fourth data frame D4 is forty eight, the predetermined count threshold C may be 47, but may be smaller than 47.

At steps S160 and S170, the data matched filter 240 multiplies the data match signal s'[n–$k_{sync}$Ts2] generated through the sync information Sync_info by the delayed input signal DEL_S to perform the calculation as shown in following Equation (7), and compares the following calculation result with the data threshold DATA_Th to read the data.

$$\sum_{n=0}^{X} x_{d4}[n]s'[n-k_{sync}Ts2] \quad \text{Equation (7)}$$

The data threshold DATA_Th may be influenced by the number of patterns in the modulation intervals Mod'''1 to Mod'''4, the coding type and the modulation form. If all the data intervals become the modulation intervals Mod'''1 to Mod'''4, when the data threshold DATA_Th is the same as the maximum result value ResultMax, the data may be stably read. However, aspects of the present invention is not limited thereto, and the data threshold DATA_Th may be a value obtained by multiplying any multiple provided by software for controlling the protocol parser 220 or the NFC device 2 by the maximum result value ResultMax.

When the phase is modulated to 0° as shown in the drawing, the calculation result of the Equation (7) exceeds the data threshold DATA_Th, and the data matched filter 240 reads the logic of the data DATA as 1. In contrast, when the phase is modulated to 180°, the calculation result of the Equation (7) is smaller than the data threshold DATA_Th, and the data matched filter 240 reads the logic of the data DATA as 0.

In a peak detection type NFC device that reads data using a peak of signal to be input to the antenna, an error may occur in the reception operation of the start pattern when noise, for example, in the form of an abnormal glitch is input. Accordingly, when performing the calculation on the individual signal pattern in the start pattern and determining reception of the start pattern according to the calculation result as in the present invention, the device is less influenced by noise, for example, in the form of an abnormal glitch, and the distance performance of the NFC device may be enhanced.

Furthermore, a data loss during the start pattern detection time may be prevented by the delay operation of the delay cell 230 of the present invention. Further, the data in which the data matched filter is encoded is read using the calculation result of the start pattern, and even if noise is constantly input to the NFC device 2, the NFC device 2 may stably operate the read operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An NFC device comprising:
   an antenna which receives a data frame which includes a start pattern including first and second pattern signals modulated by a sub-carrier frequency and that are succeedingly input in the time domain, and a data pattern corresponding to the start pattern;
   an analog-to-digital converter which samples the first pattern signal at a sampling period to generate a first input signal, and samples the second pattern signal at the sampling period to generate a second input signal; and
   a modem which receives the first input signal and the second input signal, and determines reception of the start pattern on the basis of the first input signal and the second input signal,
   wherein the modem includes a first sub-matched filter which multiplies a first match signal generated on the basis of the sampling period by the first input signal to calculate a first result value of the first match signal and multiplies the first match signal by the second input signal to calculate a second result value of the first match signal, and a second sub-matched filter which multiplies a second match signal that is based on the sampling period and has a phase different from the first match signal by the first input signal to calculate a first result value of the second match signal, and multiplies the second match signal by the second input signal to calculate a second result value of the second match signal, and
   the first sub-matched filter determines reception of the start pattern when the first result value of the first match signal and the second result value of the first match signal exceed a predetermined start pattern threshold or when the first result value of the second match signal and the second result value of the second match signal exceed the predetermined start pattern threshold.

2. The NFC device of claim 1, wherein the first sub-matched filter stores a first count that is set to 0,
   when the first result value of the first match signal exceeds the predetermined start pattern threshold, the first count is increased by 1,
   when the second result value of the first match signal exceeds the predetermined start pattern threshold, the first count is increased by 1, and
   when the first count is equal to a predetermined count threshold, reception of the start pattern is determined.

3. The NFC device of claim 2, wherein the start pattern further includes third to $N^{th}$ pattern signals, and
   the predetermined count threshold is N−1.

4. The NFC device of claim 2, wherein when the first result value of the first match signal is smaller than the predetermined start pattern threshold, the first count is set to 0, and
   when the second result value of the first match signal is smaller than predetermined start pattern threshold, the first count is set to 0.

5. The NFC device of claim 1, wherein the analog-to-digital converter samples the data pattern at the sampling period to generate a data pattern input signal, and
   when the first and second result values of the first match signal and the first and second result values of the second match signal exceed the predetermined start pattern threshold, the modem reads data included in the data pattern, on the basis of a maximum result value among the first and second result values of the first match signal and the first and second result values of the second match signal, and the data pattern input signal.

6. The NFC device of claim 5, wherein the modem further includes
   a filter selector which selects a data match signal corresponding to the maximum result value among the first match signal and the second match signal; and
   a data matched filter which multiplies the data match signal by the data pattern input signal to calculate a data result value, and compares the data result value with the maximum result value to read the data included in the data pattern.

7. The NFC device of claim 5, wherein the modem further includes
a filter selector which selects a data match signal corresponding to the maximum result value among the first match signal and the second match signal; and
a data matched filter which multiplies the data match signal by the data pattern input signal to calculate a data result value, and compares the data result value with a data threshold that is twice the maximum result value to read the data included in the data pattern.

8. The NFC device of claim 1, wherein the period of the sub-carrier frequency is a multiple of a sub-carrier sampling cycle coefficient (SCSC) with respect to the sampling period, and
the sub-carrier sampling cycle coefficient is at least one of 16 or 32.

9. The NFC device of claim 8, wherein the predetermined start pattern threshold is calculated by following Equation (1):

$$\text{Start pattern Threshold}(\gamma) = V_{max-min} \times \text{SCSC}/\Delta \text{SNR} \quad (1)$$

in Equation (1), Start pattern Threshold is the predetermined start pattern threshold, $V_{max-min}$ is a difference between a maximum value and a minimum value of voltages of a first input signal and a second input signal, SCSC is the sub-carrier sampling cycle coefficient, and SNR is a signal-to-noise ratio coefficient specified in advance in the NFC device.

10. The NFC device of claim 1, wherein the analog-to-digital converter samples the data pattern at the sampling period to generate a data pattern input signal, and
the modem further includes a data matched filter which receives the data pattern input signal in accordance with reception of the start pattern.

11. The NFC device of claim 10, wherein the modem further includes a delay cell which delays the time when the data pattern input signal is input to the data matched filter to correspond to the determination of reception of the start pattern.

12. An NFC device comprising:
an antenna which receives a data frame which includes a start pattern including first and second pattern signals modulated by a sub-carrier frequency and that are succeedingly input in the time domain, and a data pattern corresponding to the start pattern;
an analog-to-digital converter which samples each of the first and second pattern signals at a sampling period to generate each of a first input signal and a second input signal, and samples the data pattern at the sampling period to generate a data pattern input signal; and
a modem which receives the first and second input signals and the data pattern input signal, and reads data included in the data pattern on the basis of the first and second input signals and the data pattern input signal,
wherein the modem includes a first sub-matched filter which multiplies a first match signal generated on the basis of the sampling period by the first input signal to calculate a first result value of the first match signal and multiplies the first match signal by the second input signal to calculate a first result value of the first match signal, and a second sub-matched filter which multiplies a second match signal that is based on the sampling period and has a phase different from the first match signal by the first input signal to calculate a first result value of the second match signal, and multiplies the second match signal by the second input signal to calculate a second result value of the second match signal, and
the modem reads the data included in the data pattern, on the basis of a maximum result value among the first and second result values of the first match signal and the first and second result values of the second match signal, and the data pattern input signal.

13. The NFC device of claim 12, wherein when the first and second result values of the first match signal exceed a predetermined start pattern threshold, the first sub-matched filter determines reception of the start pattern.

14. The NFC device of claim 13, wherein the first sub-matched filter stores a first count that is set to 0,
when the first result value of the first match signal exceeds the predetermined start pattern threshold, the first count is increased by 1,
when the second result value of the first match signal exceeds the predetermined start pattern threshold, the first count is increased by 1, and
when the first count is equal to a predetermined count threshold, reception of the start pattern is determined.

15. The NFC device of claim 14, wherein, when the first result value of the first match is smaller than the predetermined start pattern threshold, the first count is set to 0, and
when the second result value of the first match signal is smaller than predetermined start pattern threshold, the first count is set to 0.

16. The NFC device of claim 12, wherein the modem determines reception of a start pattern on the basis of the first input signal and the second input signal received, and
the modem further includes a data matched filter which receives the data pattern input signal in accordance with reception of the start pattern.

17. The NFC device of claim 16, wherein the modem further includes a delay cell which delays the time when the data pattern input signal is input to the data matched filter to correspond to the determination of reception of the start pattern.

18. A method of operating an NFC device, the method comprising:
setting data type information on the basis of received data type;
receiving a data frame which includes a start pattern including first and second pattern signals modulated by a sub-carrier frequency in accordance with the received data type and that are succeedingly input in the time domain, and a data pattern corresponding to the start pattern;
sampling the first pattern signal at a sampling period to generate a first input signal, and sampling the second pattern signal at the sampling period to generate a second input signal; and
multiplying a first match signal generated on the basis of the sampling period by the first input signal to calculate a first result value of the first match signal, and multiplying the first match signal by the second input signal to calculate a second result value of the first match signal, by a first sub-matched filter;
multiplying a second match signal that is based on the sampling period and has a phase different from the first match signal by the first input signal to calculate a first result value, of the second match signal and multiplying the second match signal by the second input signal to calculate a second result value of the second match signal, by a second sub-matched filter which is different from the first sub-matched filter;

selecting an enable filter among the first and second sub-matched filters, on the basis of the first and second result values of the first match signal and the first and second result values of the second match signal; and reading data included in the data pattern on the basis of the enable filter.

19. The method of operating the NFC device of claim 18, wherein the data type information includes at least one of the sub-carrier frequency, a sub-carrier sampling cycle coefficient (SCSC) which is a ratio of a period of the sub-carrier frequency and the sampling period, and the number of pattern signals included in the start pattern.

20. The method of operating the NFC device of claim 19, wherein the selection of the enable filter selects the enable filter among the first and second sub-matched filters to correspond to the maximum result value among the first and second result values of the first match signal and the first and second result values of the second match signal.

* * * * *